United States Patent
Nagase et al.

(10) Patent No.: US 8,299,552 B2
(45) Date of Patent: Oct. 30, 2012

(54) MAGNETORESISTIVE ELEMENT AND MAGNETIC MEMORY

(75) Inventors: Toshihiko Nagase, Sagamihara (JP); Masatoshi Yoshikawa, Yokohama (JP); Eiji Kitagawa, Sagamihara (JP); Katsuya Nishiyama, Yokohama (JP); Tadaomi Daibou, Kawasaki (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 936 days.

(21) Appl. No.: 12/233,100

(22) Filed: Sep. 18, 2008

(65) Prior Publication Data
US 2009/0079018 A1 Mar. 26, 2009

(30) Foreign Application Priority Data
Sep. 26, 2007 (JP) ................. 2007-250283

(51) Int. Cl.
 *H01L 29/82* (2006.01)
(52) U.S. Cl. ........... 257/421; 257/E29.323; 438/3; 438/48
(58) Field of Classification Search ........... 257/421, 257/E29.323; 438/3, 48
See application file for complete search history.

(56) References Cited

U.S. PATENT DOCUMENTS

| | | |
|---|---|---|
| 2007/0086121 A1 | 4/2007 | Nagase et al. |
| 2008/0088980 A1 | 4/2008 | Kitagawa et al. |

FOREIGN PATENT DOCUMENTS

| | | | |
|---|---|---|---|
| CN | 1938780 A | | 3/2007 |
| JP | 2001-189010 | | 7/2001 |
| JP | 2001189010 A | * | 7/2001 |
| JP | 2002-111094 | | 4/2002 |
| JP | 2002358616 A | * | 12/2002 |
| JP | 2006-252605 | | 9/2006 |
| JP | 2007-142364 | | 6/2007 |
| KR | 10-2007-0042891 | | 4/2007 |

OTHER PUBLICATIONS

U.S. Appl. No. 12/409,716, filed Mar. 24, 2009, Kitagawa, et al.
U.S. Appl. No. 13/043,064, filed Mar. 8, 2011, Daibou, et al.
U.S. Appl. No. 12/409,654, filed Mar. 24, 2009, Yoshikawa, et al.
Tomoyuki Maeda, "Fabrication of Highly (001) Oriented $L1_0$ FePt Thin Film Using NiTa Seed Layer", IEEE Transactions on Magnetics, vol. 41, No. 10, Oct. 2005, pp. 3331-3333.
Toshio Suzuki et al., "Preparation of ordered Fe-Pt thin films for perpendicular magnetic recording media", Journal of Magnetism and Magnetic Materials, 193, 1999, pp. 85-88.
U.S. Appl. No. 13/310,154, filed Dec. 2, 2011, Daibou, et al.

* cited by examiner

*Primary Examiner* — Zandra Smith
*Assistant Examiner* — Marvin Payen
(74) *Attorney, Agent, or Firm* — Oblon, Spivak, McClelland, Maier & Neustadt, L.L.P.

(57) ABSTRACT

A magnetoresistive element includes a first underlying layer having an NaCl structure and containing a nitride orienting in a (001) plane, a first magnetic layer provided on the first underlying layer, having magnetic anisotropy perpendicular to a film surface, having an $L1_0$ structure, and containing a ferromagnetic alloy orienting in a (001) plane, a first nonmagnetic layer provided on the first magnetic layer, and a second magnetic layer provided on the first nonmagnetic layer and having magnetic anisotropy perpendicular to a film surface.

18 Claims, 17 Drawing Sheets

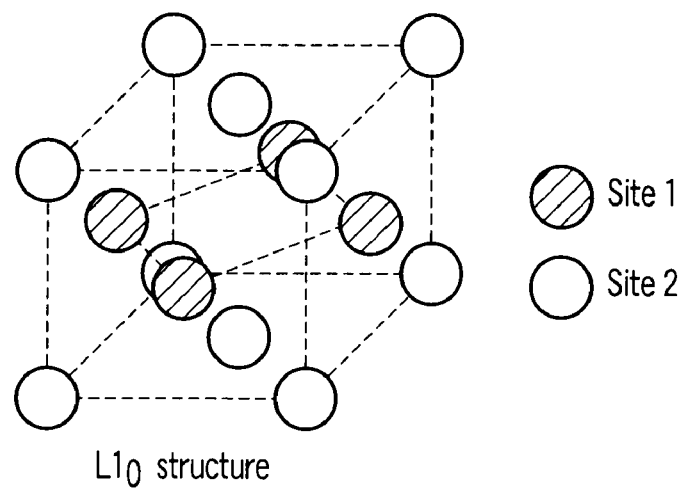
L1₀ structure
F I G. 1
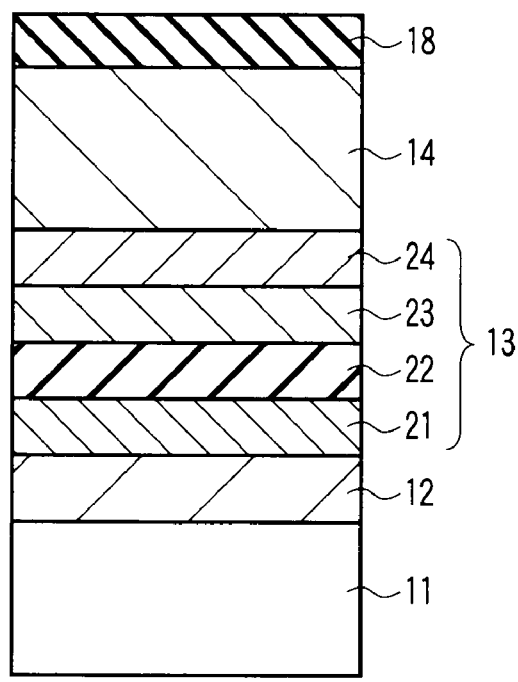
F I G. 2

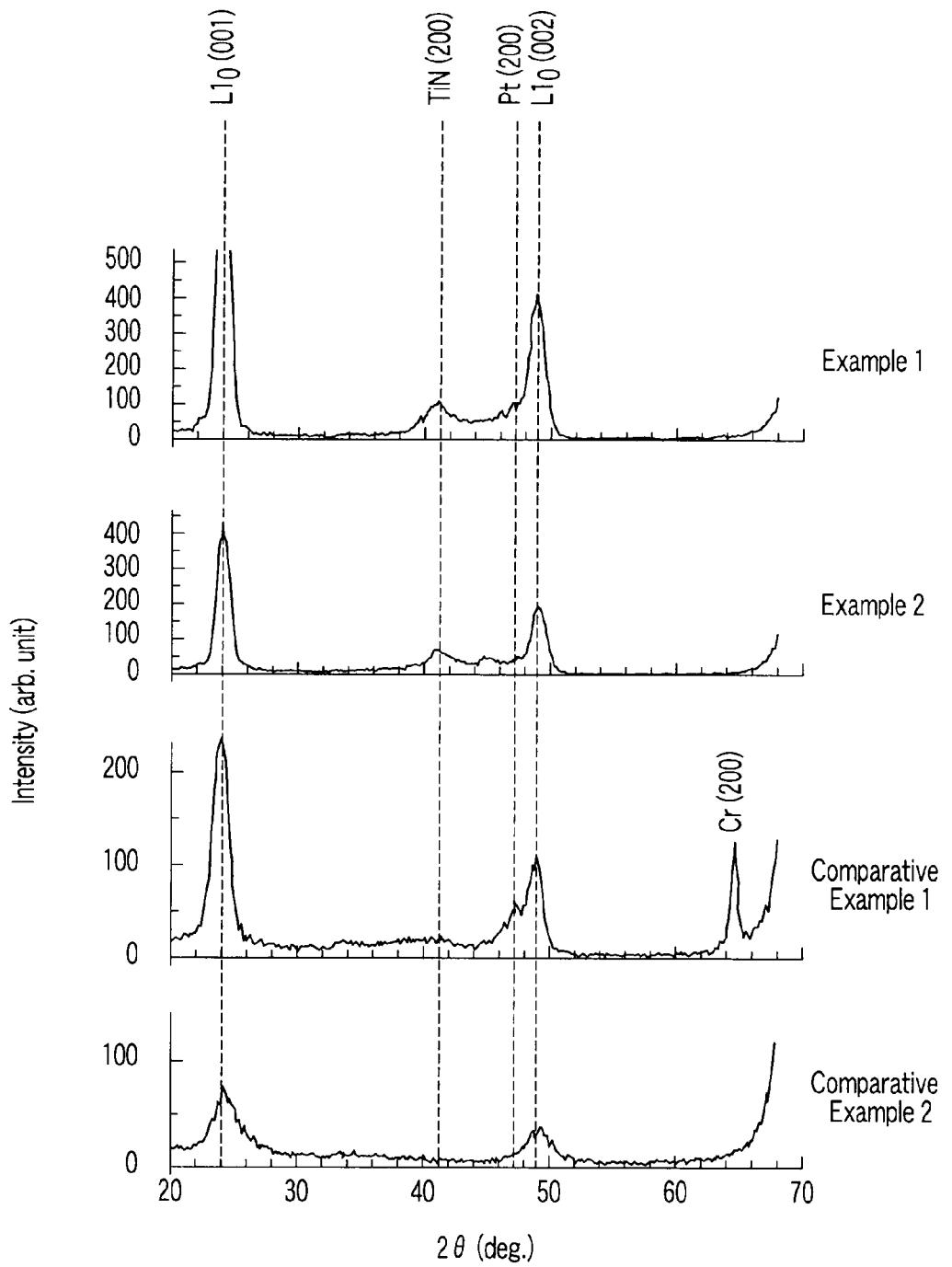
F I G. 7

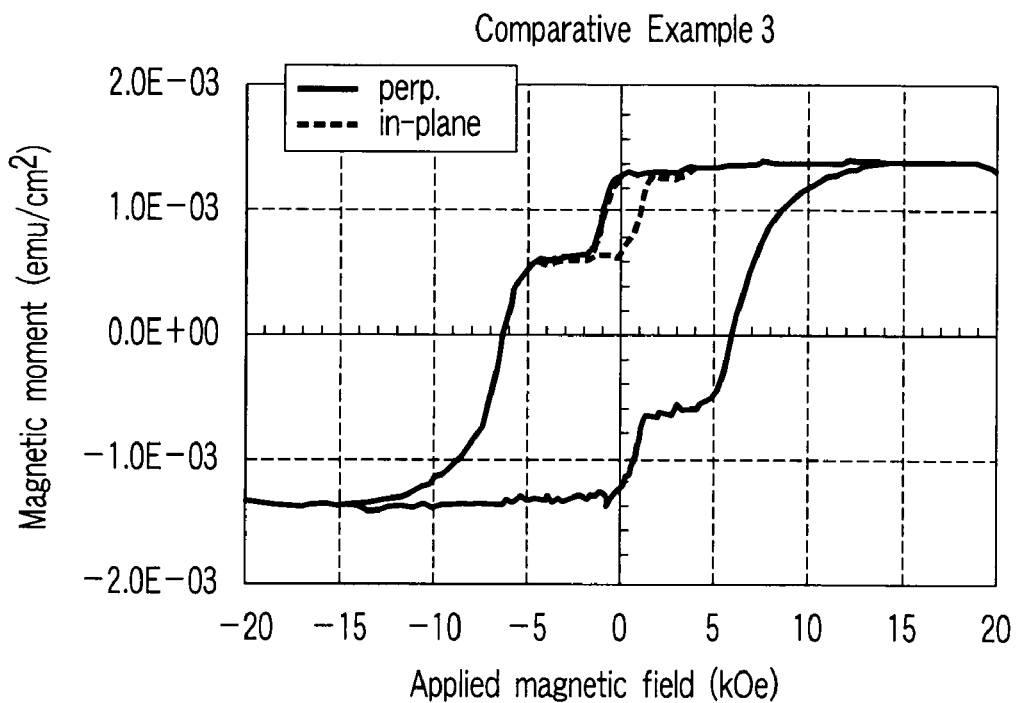
FIG. 11
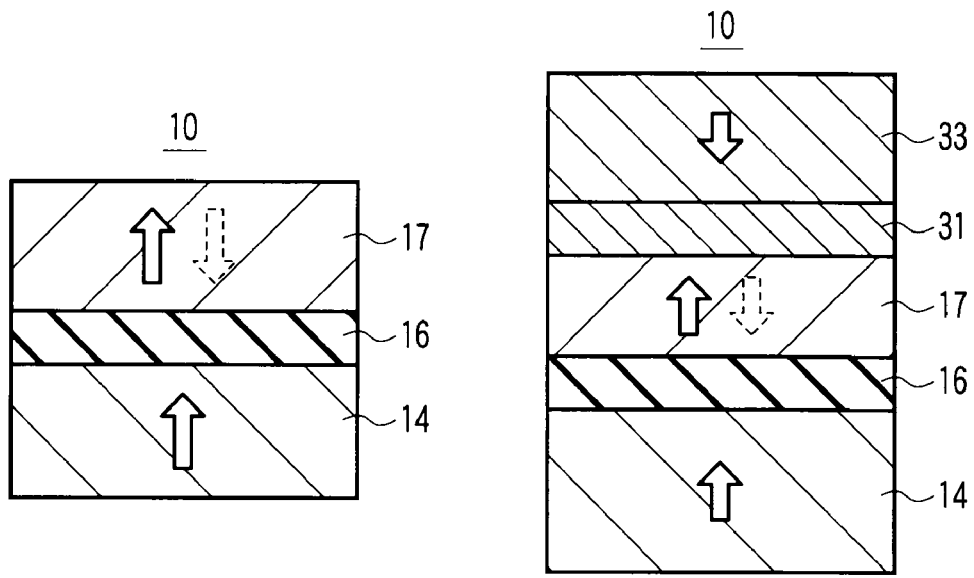
FIG. 12
FIG. 14

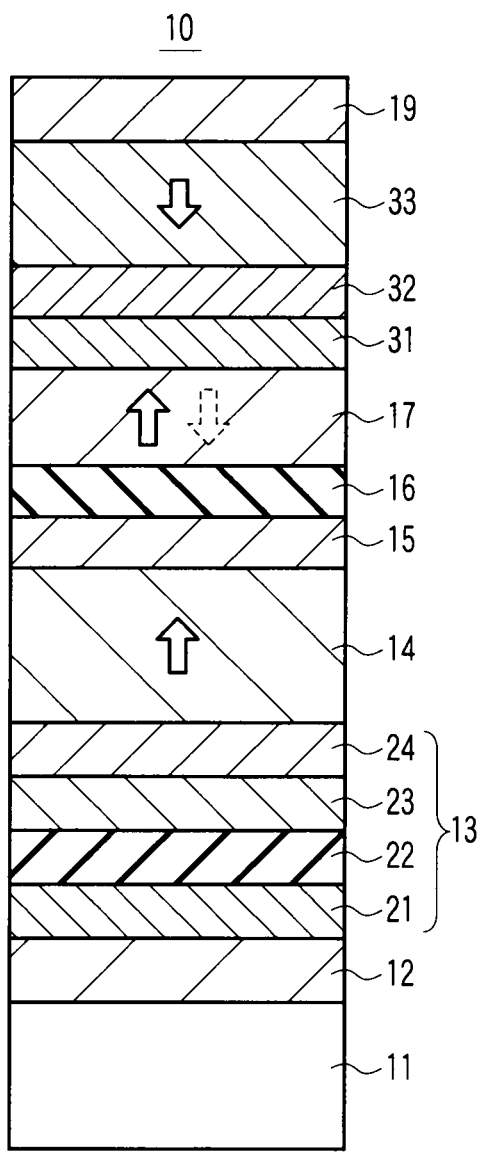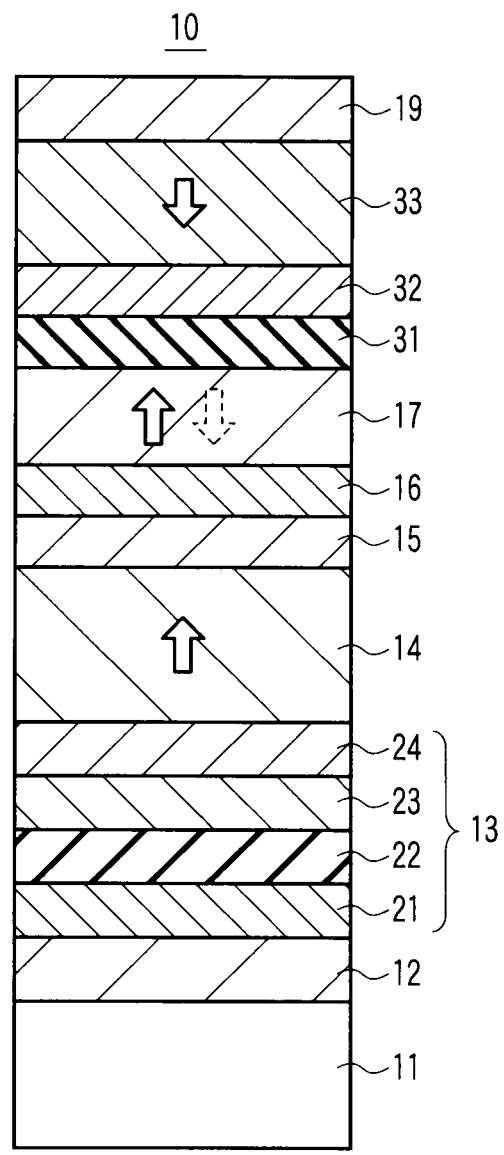
F I G. 15　　　　F I G. 16

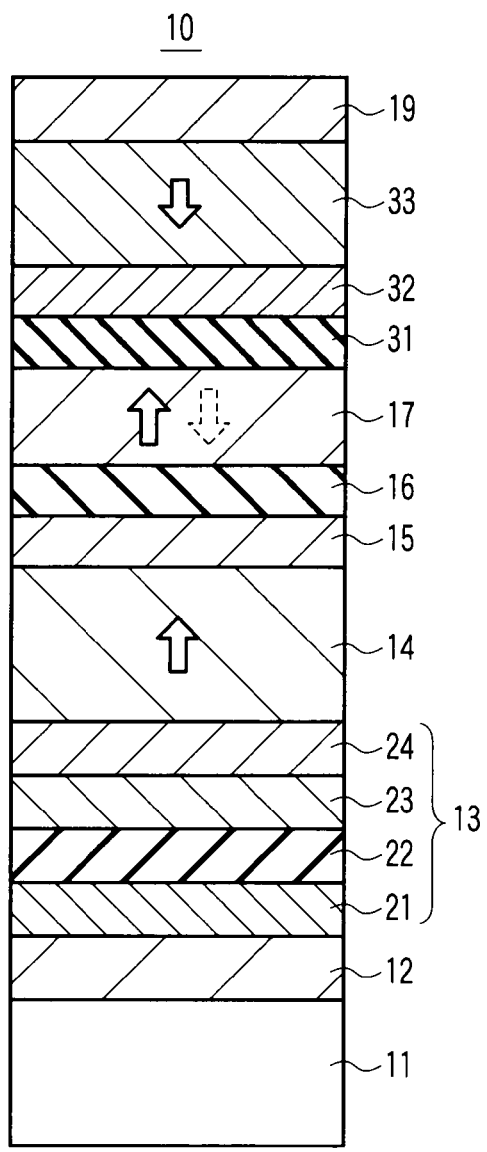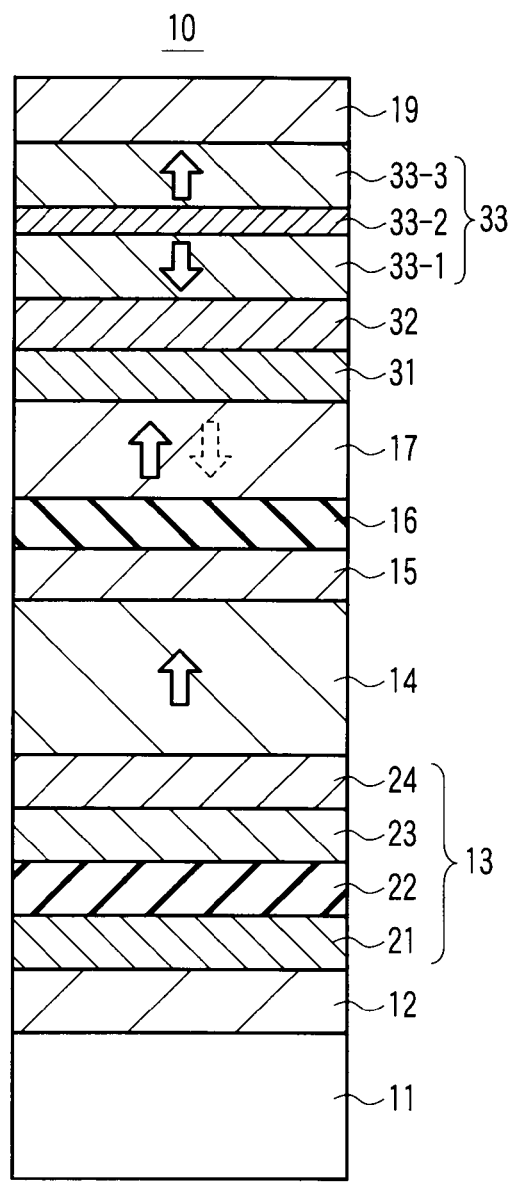
F I G. 17     F I G. 18

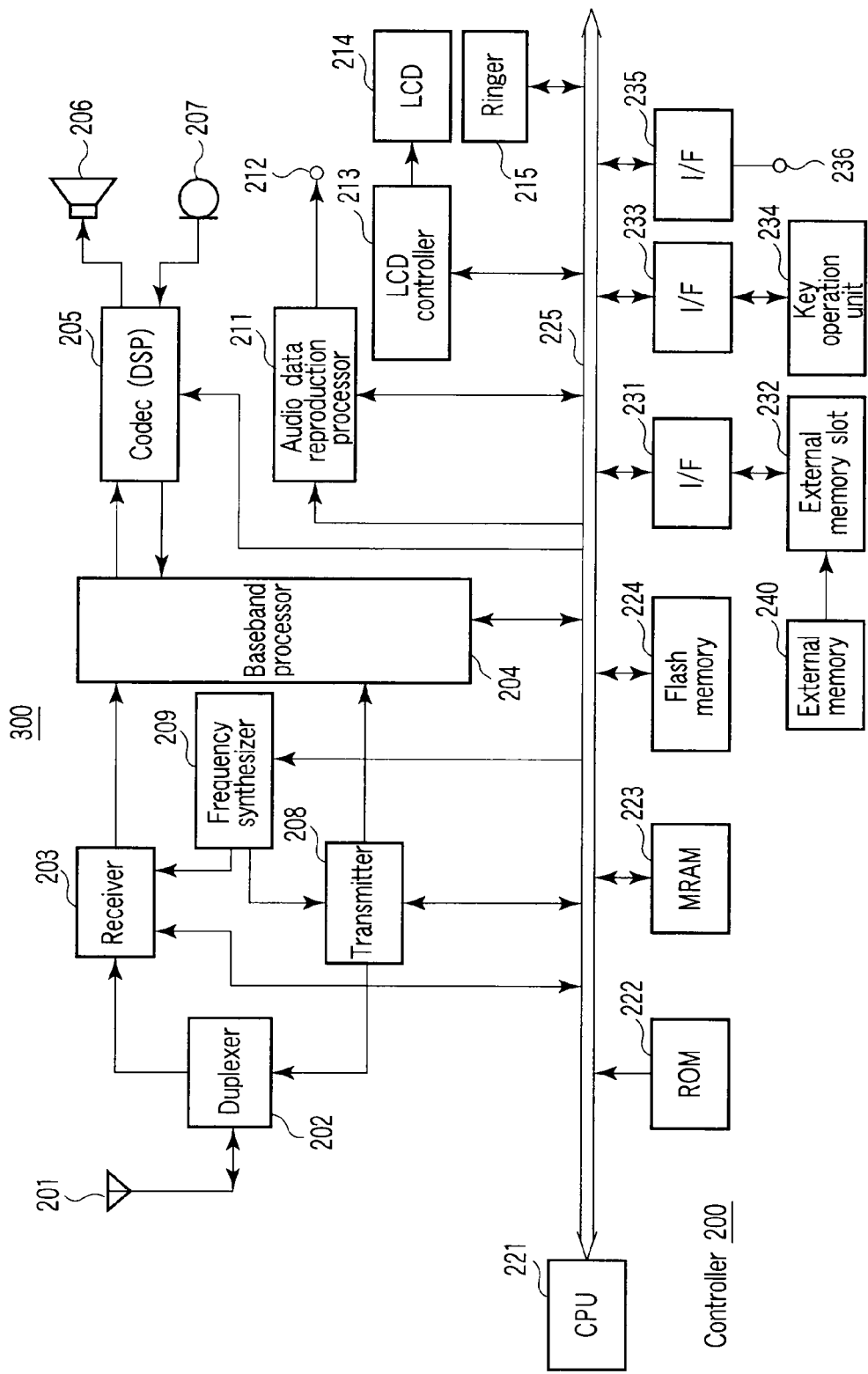
F I G. 26

To first MRAM data rewrite controller

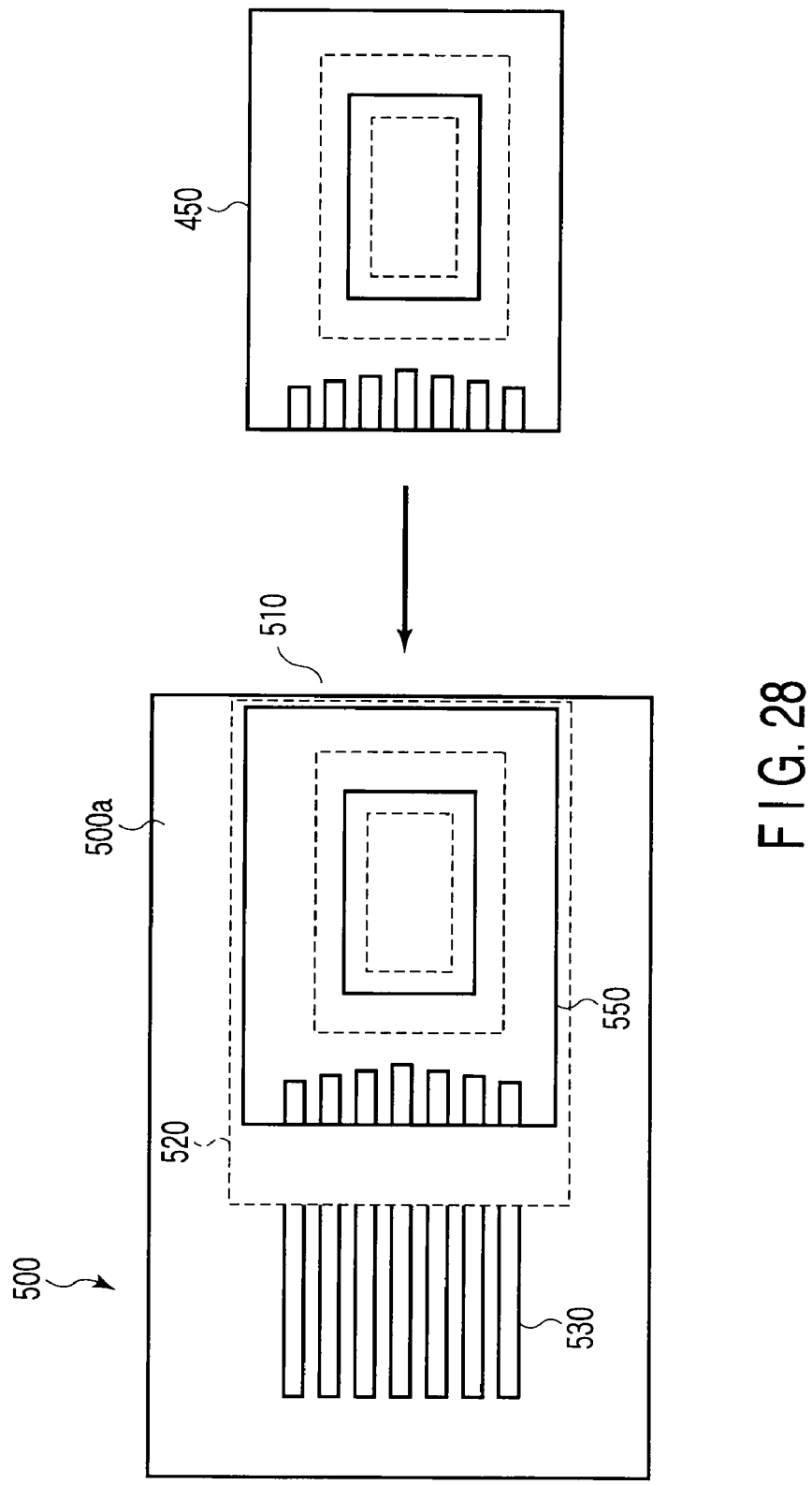
F I G. 28

MAGNETORESISTIVE ELEMENT AND MAGNETIC MEMORY

CROSS-REFERENCE TO RELATED APPLICATIONS

This application is based upon and claims the benefit of priority from prior Japanese Patent Application No. 2007-250283, filed Sep. 26, 2007, the entire contents of which are incorporated herein by reference.

BACKGROUND OF THE INVENTION

1. Field of the Invention

The present invention relates to a magnetoresistive element and magnetic memory, e.g., a magnetoresistive element capable of recording information by supplying a current in two directions, and a magnetic memory using the same.

2. Description of the Related Art

The magnetoresistive effect is applied to a hard disk drive (HDD) as a magnetic memory device and presently put into practical use. The GMR (Giant Magnetoresistive) effect or TMR (Tunneling Magnetoresistive) effect is applied to a magnetic head of the HDD. Both the GMR effect and TMR effect detect a magnetic field from a magnetic medium by using a resistance change caused by an angle the magnetization directions in two magnetic layers make with each other.

Recently, various techniques have been proposed to implement a magnetic random access memory (MRAM) by using a GMR element or TMR element. An example is a method of recording information "1" or "0" in accordance with the magnetization configuration of an MTJ (Magnetic Tunnel Junction) element, and reading the information by using the resistance change caused by the TMR effect. Various techniques have been proposed to put an MRAM using this method into practical use as well. An example is a magnetic field writing method that switches the direction of magnetization in a magnetic layer by using a magnetic field generated by a current. A magnetic field generated by a current naturally increases as the current increases. However, due to advances in micropatterning, a current that can be supplied to an interconnection is limited. It is possible to increase the efficiency of a magnetic field generated by a current and reduce a current value necessary to switch magnetization in a magnetic layer by decreasing the distance between an interconnection and the magnetic layer or by using a yoke structure that concentrates the generated magnetic field. However, micropatterning increases a magnetic field required for magnetization reversal in a magnetic field. This makes it very difficult to reduce a current and advance micropatterning at the same time.

Micropatterning increases a magnetic field necessary for magnetization reversal in a magnetic layer because the magnetic energy that overcomes a thermal disturbance is necessary. This magnetic energy can be increased by increasing the magnetic anisotropic energy density and the volume of the magnetic layer. Since micropatterning reduces the volume, however, a general approach is to increase the magnetic shape anisotropic energy or magnetocrystalline anisotropic energy, i.e., increase the magnetic anisotropic energy density. Unfortunately, an increase in magnetic energy of a magnetic layer increases the reversing magnetic field as described above. This makes it very difficult to reduce a current and advance micropatterning at the same time.

Recently, magnetization reversal caused by a spin-polarized current has been theoretically predicted and experimentally confirmed, and an MRAM using a spin-polarized current has been proposed. This method can switch magnetization in a magnetic layer solely by supplying a spin-polarized current to the magnetic layer. If the volume of the magnetic layer is small, smaller spin-polarized electrons need be injected. Therefore, the method is expected to advance micropatterning and reduce a current at the same time. In addition, the method does not use any magnetic field generated by a current. Accordingly, the method has the advantage that the cell area can be reduced because no yoke structure for increasing a magnetic field is necessary. However, even in the magnetization reversing method using a spin-polarized current, the problem of thermal disturbance naturally arises as micropatterning advances.

As described previously, the magnetic anisotropic energy density must be increased in order to secure a high thermal disturbance resistance. An in-plane magnetization arrangement that has been principally studied so far generally uses the magnetic shape anisotropy. In this case, the magnetic anisotropy is secured by using the shape. This makes a switching current sensitive to the shape, and increases the variation in switching current as micropatterning advances, thus posing a problem. To increase the magnetic anisotropic energy density by using the magnetic shape anisotropy, it is possible to increase the aspect ratio of an MTJ element, increase the film thickness of a magnetic layer, or increase the saturation magnetization in the magnetic layer.

Increasing the aspect ratio of an MTJ element is unsuitable to increase the capacity because the cell area increases. Increasing the film thickness or saturation magnetization of a magnetic material is not preferable because the value of a spin-polarized current required for magnetization reversal increases. When using not the magnetic shape anisotropy but the magnetocrystalline anisotropy in the in-plane magnetization arrangement, if a material (e.g., a Co—Cr alloy material used in a hard disk medium) having a high magnetocrystalline anisotropic energy density is used, the crystallographic axis largely disperse in the plane. This decreases the MR (Magnetoresistive), or induces an incoherent precession. As a consequence, the switching current increases.

By contrast, when using the magnetocrystalline anisotropy in a perpendicular magnetization arrangement, it is possible to suppress the dispersion of the crystallographic axis that is the problem in the in-plane magnetization arrangement. For example, the crystal structure of the Co—Cr alloy material described above is the hexagonal structure, and has uniaxial magnetocrystalline anisotropy whose axis of easy magnetization is the c axis. Therefore, the crystal orientation need only be controlled such that the c axis is parallel to a direction perpendicular to the film surface. In the in-plane magnetization arrangement, the c axis must be uniaxially arranged in the film surface, and the rotation of each crystal grain in the film surface rotates the crystallographic axis and disperses the uniaxial direction. In the perpendicular magnetization arrangement, the c axis is perpendicular to the film surface. Accordingly, even when each crystal grain rotates in the film surface, the c axis remains perpendicular and does not disperse. Similarly, a perpendicular magnetization MTJ arrangement can be implemented by controlling the c axis in the perpendicular direction in the tetragonal structure as well. Examples of a magnetic material having the tetragonal structure are an Fe—Pt ordered alloy, Fe—Pd ordered alloy, Co—Pt ordered alloy, Fe—Co—Pt ordered alloy, Fe—Ni—Pt ordered alloy, and Fe—Ni—Pd ordered alloy each having the $L1_0$ crystal structure. When implementing a perpendicular magnetization MTJ arrangement by using the magnetocrystalline anisotropy, the aspect ratio of an MTJ element can be 1. Therefore, this MTJ arrangement is suitable for micropatterning as well.

A high magnetoresistive ratio is necessary to increase the capacity of an MRAM. Recently, many MTJ elements using MgO as a barrier material having a high magnetoresistive ratio have been reported, and it is regarded as important that the (100) plane of MgO orients in order to achieve a high magnetoresistive ratio. MgO has an NaCl crystal structure, and its (100) plane is favorable from the viewpoint of lattice matching with the (001) plane of the $L1_0$ structure. Accordingly, the use of an $L1_0$ perpendicular magnetization film as a magnetic layer in a perpendicular magnetization MTJ element is very promising from the viewpoint of the magnetoresistive ratio.

To use the $L1_0$ structure as a perpendicular magnetization film, however, the crystal orientation must be controlled such that the (001) plane orients. This requires an underlying layer for controlling the crystal orientation. In the magnetization reversing method using a spin-polarized current, the resistance of an MTJ element must be decreased because a current flows through a barrier layer. This makes it unfavorable to use an underlying layer having a high resistance. Also, to achieve a high magnetoresistive ratio, it is undesirable to use an element that decreases the magnetoresistive ratio as the material of the underlying layer, because the influence of diffusion occurring in a heating step necessary to order a magnetic layer into the $L1_0$ structure is significant.

As described above, if magnetization reversal by a spin-polarized current is achieved in a perpendicular magnetization MTJ element, it is possible to reduce a write current, secure a high thermal disturbance resistance of bit information, and reduce the cell area at the same time. In addition, a high magnetoresistive ratio can be obtained if it is possible to form an MTJ element using a magnetic material having the $L1_0$ structure that is favorable from the viewpoint of lattice matching with the MgO barrier. However, neither a report nor a practical method having achieved a high magnetoresistive ratio by forming an MTJ element by using a magnetic material having the $L1_0$ structure has been proposed.

BRIEF SUMMARY OF THE INVENTION

According to an aspect of the present invention, there is provided a magnetoresistive element comprising: a first underlying layer having an NaCl structure and containing a nitride orienting in a (001) plane; a first magnetic layer provided on the first underlying layer, having magnetic anisotropy perpendicular to a film surface, having an $L1_0$ structure, and containing a ferromagnetic alloy orienting in a (001) plane; a first nonmagnetic layer provided on the first magnetic layer; and a second magnetic layer provided on the first nonmagnetic layer and having magnetic anisotropy perpendicular to a film surface.

According to an aspect of the present invention, there is provided a magnetic memory comprising a memory cell including the magnetoresistive element, and a first electrode and a second electrode sandwiching the magnetoresistive element to supply a current to the magnetoresistive element.

BRIEF DESCRIPTION OF THE SEVERAL VIEWS OF THE DRAWING

FIG. 1 is a view illustrating the $L1_0$ structure;

FIG. 2 is a sectional view illustrating a stacked structure including an underlying layer 13 and ferromagnetic alloy 14 according to the first embodiment;

FIG. 7 is a graph illustrating X-ray diffraction profiles in Examples 1 and 2 and Comparative Examples 1 and 2;

FIG. 11 is a graph illustrating MH loops according to Comparative Example 3;

FIG. 12 is a schematic view of an MTJ element 10 having a single-pin structure according to the first embodiment;

FIG. 14 is a schematic view illustrating an MTJ element 10 having a dual-pin structure according to the first embodiment;

FIG. 15 is a sectional view illustrating the arrangement of an MTJ element 10 of Practical Example 2-1;

FIG. 16 is a sectional view illustrating the arrangement of an MTJ element 10 of Practical Example 2-2;

FIG. 17 is a sectional view illustrating the arrangement of an MTJ element 10 of Practical Example 2-3;

FIG. 18 is a sectional view illustrating the arrangement of an MTJ element 10 of Practical Example 2-4;

FIG. 26 is a block diagram illustrating a portable phone terminal 300 according to Application Example 2 of the MRAM;

FIG. 28 is a plan view illustrating a transfer apparatus 500 for transferring data to the MRAM card;

DETAILED DESCRIPTION OF THE INVENTION

Figure 3:
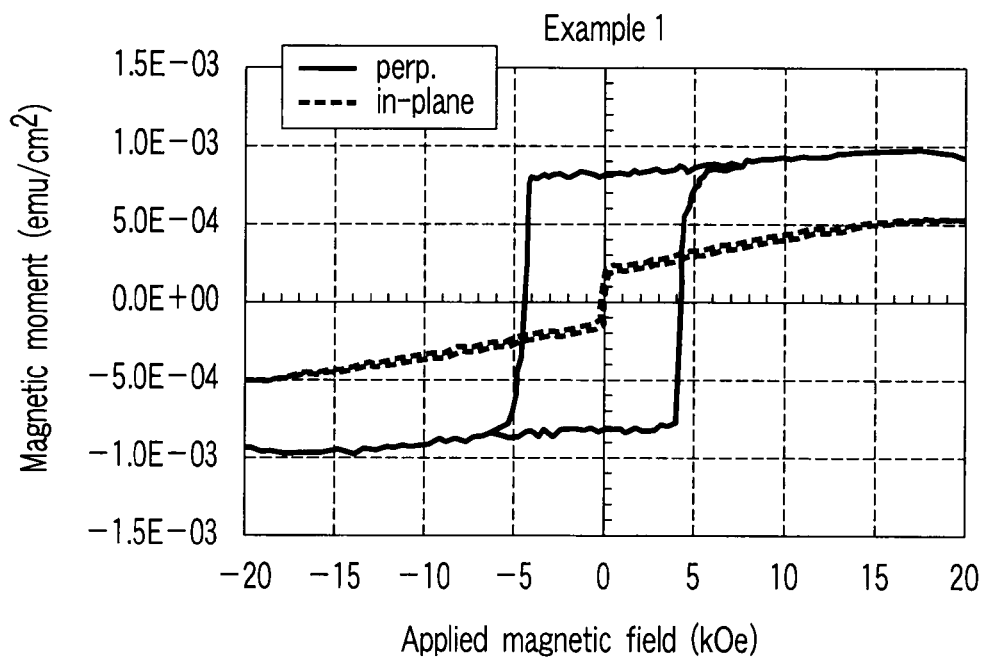
FIG. 3 is a graph illustrating MH loops according to Example 1.
Figure 4:
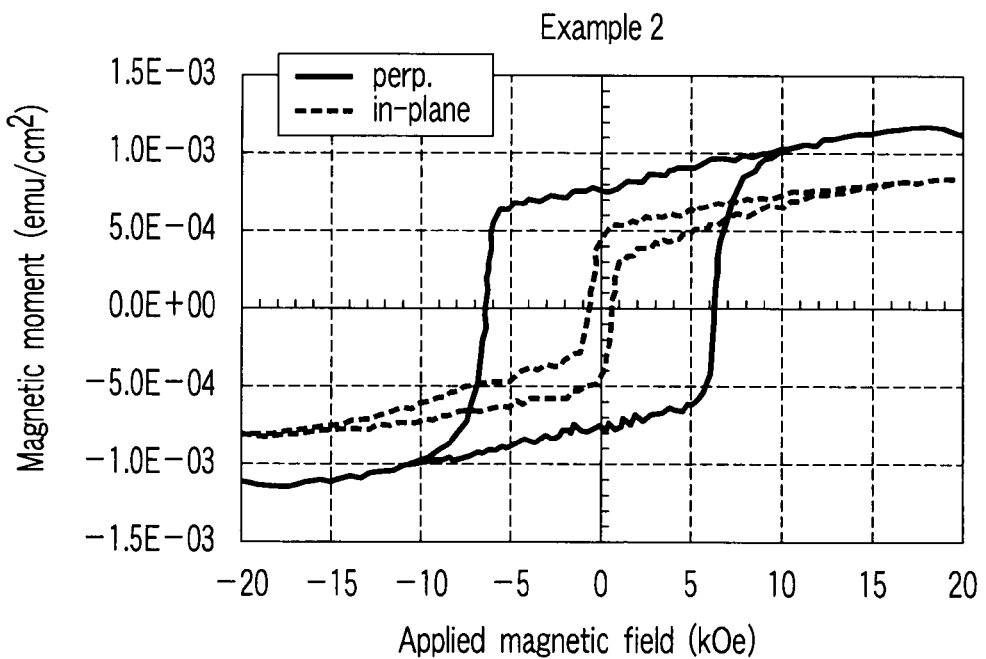
FIG. 4 is a graph illustrating MH loops according to Example 2.
Figure 5:
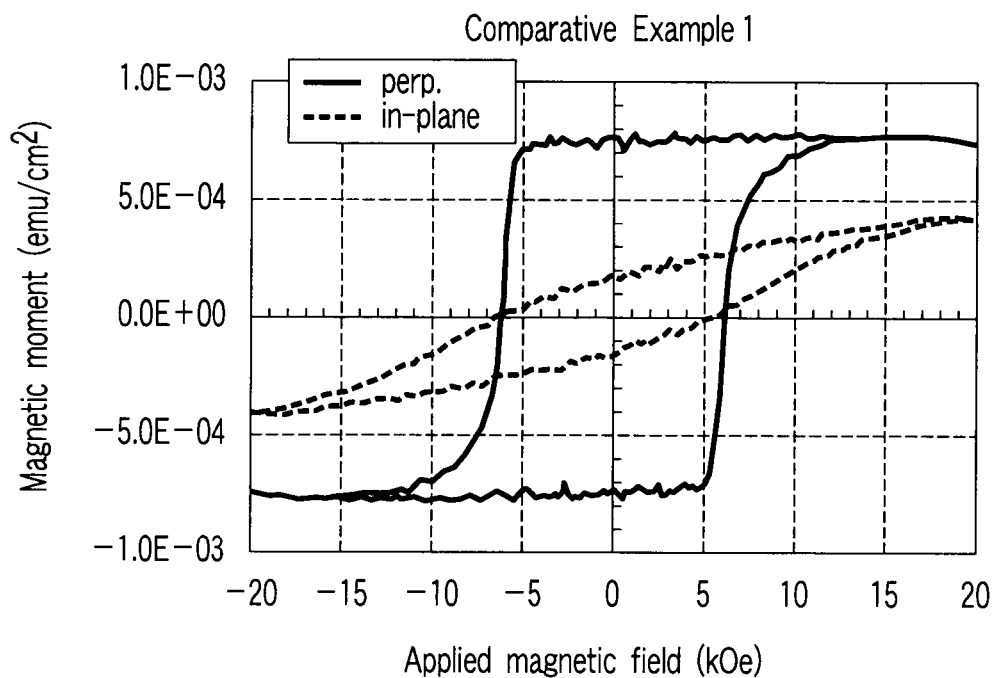
FIG. 5 is a graph illustrating MH loops according to Comparative Example 1.
Figure 6:
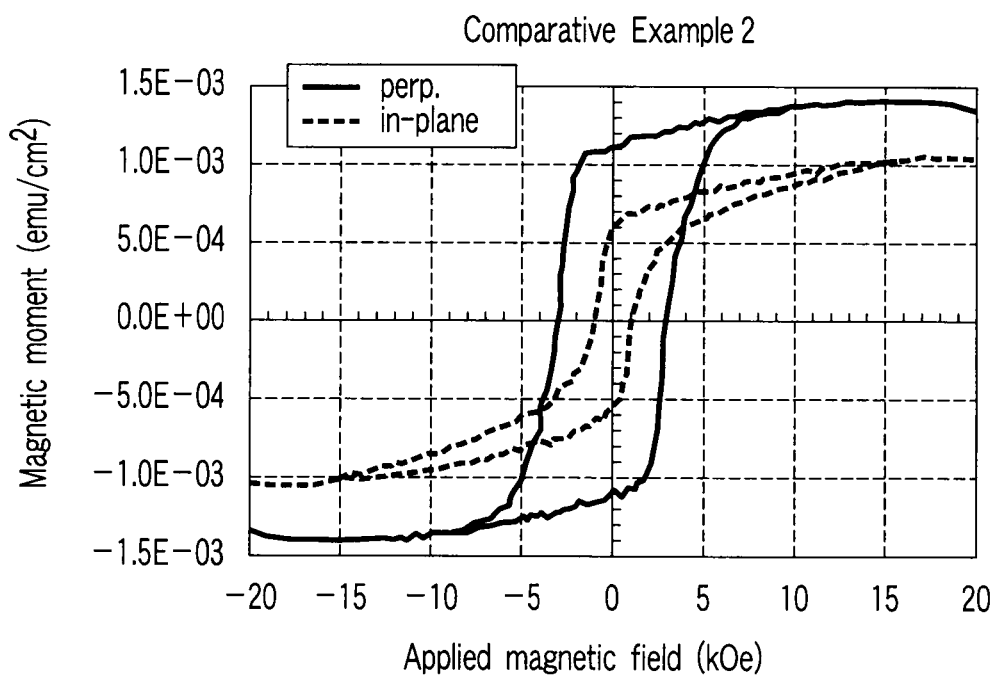
FIG. 6 is a graph illustrating MH loops according to Comparative Example 2.

Embodiments of the present invention will be explained below with reference to the accompanying drawing. Note that in the following explanation, the same reference numerals denote elements having the same functions and arrangements, and a repetitive explanation will be made only when necessary.

First Embodiment

[1] Arrangement of Underlying Layer Made of Ferromagnetic Alloy Having $L1_0$ Structure $L1_0$ is an expression by "Strukturebereichi", and is also called a CuAu I type in accordance with a representative system of this structure. As shown in FIG. 1, the $L1_0$ structure is formed in an alloy containing two or more components when these component elements occupy two face-centered points (sites 1) and remaining face-centered points and corner points (sites 2) of a face-centered cubic lattice at different probabilities. Sites 1 and sites 2 are equal in number, and the stoichiometric composition of the structure is 50 at %. In various alloys that form face-centered cubic solid solutions, the $L1_0$ structure appears near the symmetric composition.

When the constituent elements take this ordered arrangement on the lattice points, (002) or (110) planes equivalent in the face-centered cubic lattice are classified into (001) or (110) planes occupying only sites 1 or 2, and the symmetry of the structure decreases. Consequently, in an X-ray or electron-beam diffraction image of the $L1_0$ structure, superlattice reflection of the (001) or (110) plane forbidden in the face-centered cubic lattice appears in addition to the basic reflection of the face-centered cubic lattice.

In the $L1_0$ structure, a lattice constant c in the [001] direction and a lattice constant a in the [100] and [010] directions are generally unequal. In a ferromagnetic alloy having the $L1_0$ structure, therefore, the c axis is the axis of easy magnetization. To form a perpendicular magnetization film in which a direction perpendicular to the film surface is the axis of easy magnetization, the crystal orientation of the $L1_0$ structure must be controlled such that the (001) plane orients.

According to "JCPDS (Joint Committee on Powder Diffraction Standards) card, 43-1359", the intensity of the (001) plane of, e.g., FePt having the $L1_0$ structure is 30 when the diffraction intensity of the (111) plane is defined as 100. According to "JCPDS card, 43-1358", the intensity of the (001) plane of CoPt having the $L1_0$ structure is 36. In the case of the diffraction patterns of the powder specimen, the intensity ratio is regarded as that of a random orientation. It's considered to be the (001) orientation when at least the intensity of the (001) plane is higher than that of a random orientation. In practice, the (001) plane is oriented and ordered if the direction perpendicular to the film surface is the axis of easy magnetization. Therefore, diffraction from the (001) plane as superlattice reflection described above is characterized by X-ray diffraction or electron-beam diffraction.

As described previously, to form a perpendicular magnetization film having the $L1_0$ structure, the crystal orientation plane must be controlled to be the (001) plane. This requires an underlying layer for controlling the crystal orientation, and some underlying layers have been reported in the field of magnetic media. For example, reference 1 (IEEE Trans. Magn., vol. 41, 2005, pp. 3331-3333, T. Maeda) has disclosed 20-nm Pt/5-nm Cr/25-nm NiTa as underlying layers of FePt having the $L1_0$ structure. Note that in the description of a stacked film, the left side of "/" represents an upper layer, and the right side of "/" represents a lower layer. Also, reference 2 (Jpn. Pat. Appln. KOKAI Publication No. 2001-189010) has disclosed oxides, nitrides, or carbides having the NaCl structure, and the lattice constant of the oxides, nitrides, or carbides is defined to be 3.52 to 4.20 Å. Reference 3 (J. Magn. Magn. Mater., 193 (1999) 85-88, T. Suzuki et al.) has disclosed 70-nm Cr/10-nm MgO as an underlying layer.

In a stacked structure for implementing the magnetization reversing method using a spin-polarized current, it is unfavorable to use an underlying layer having a high resistance or containing an element that diffuses in a heating step required for ordering and significantly deteriorates the magnetic characteristic such as the saturation magnetization or magnetic anisotropic energy density, or the electrical characteristic such as the barrier resistance or MR ratio. From this point of view, it is unpreferable to use the underlying layers disclosed in the well-known references described above. That is, reference 1 uses Cr, which significantly decreases the magnetoresistive (MR) ratio, and reference 3 uses MgO having a high resistance in the form of a thick layer, i.e., a 10-nm thick layer. Reference 2 describes many materials having the NaCl structure. However, an oxide generally has a high resistance. Also, reference 2 has not disclosed, for a nitride and carbide, any practical means for orienting a material having the NaCl structure in the (100) plane.

Furthermore, the lattice constant of a nitride having the NaCl structure according to this embodiment need not fall within the range of 3.52 to 4.20 Å as will be described later. In addition, some magnetoresistive elements formed on an MgO single-crystal substrate have been reported, but the MR ratio is as low as a few % at room temperature. It is also very difficult to use an MgO single-crystal substrate in order to obtain a large-capacity MRAM.

[1-1] Examples of Underlying Layer

From the viewpoints as described above, the present inventors made extensive studies on an underlying layer for forming a magnetic layer having the $L1_0$ structure. FIG. 2 is a sectional view illustrating a stacked structure including an underlying layer 13 and ferromagnetic alloy 14 according to this embodiment.

In this stacked structure shown in FIG. 2, a Ta film about 5 nm thick as an adhesive layer 12 for the underlying layer 13 is formed on an Si substrate 11 with a thermal oxide film, and an FePtB film about 10 nm thick as the ferromagnetic alloy 14 having the $L1_0$ structure and an MgO film about 2 nm thick as a protective layer 18 are sequentially formed on the underlying layer 13.

An underlying layer 13 according to Example 1 of the present invention has an arrangement in which a $Co_{40}Fe_{40}B_{20}$ film about 3 nm thick as an underlying layer 21, an MgO film about 0.5 nm thick as an underlying layer 22, a TiN film about 20 nm thick as an underlying layer 23, and a Pt film about 3 nm thick as an underlying layer 24 are sequentially formed.

An underlying layer 13 according to Example 2 of the present invention has an arrangement in which a $Co_{40}Fe_{40}B_{20}$ film about 3 nm thick as an underlying layer 21, a TiN film about 20 nm thick as an underlying layer 23, and a Pt film about 3 nm thick as an underlying layer 24 are sequentially formed without any underlying layer 22.

An underlying layer 13 according to Comparative Example 1 has the arrangement of reference 1 in which an NiTa film about 20 nm thick, a Cr film about 20 nm thick, and a Pt film about 5 nm thick are sequentially formed. That is, Comparative Example 1 has an arrangement in which NiTa, Cr, and Pt are sequentially formed as an underlying layer 21, underlying layers 22 and 23, and an underlying layer 24, respectively. An underlying layer 13 according to Comparative Example 2 has an arrangement in which a $Co_{40}Fe_{40}B_{20}$ film about 3 nm thick as an underlying layer 21, an MgO film about 0.3 nm thick as an underlying layer 22, and a Pt film about 3 nm thick as an underlying layer 24 are sequentially formed without any underlying layer 23.

FePtB forming the ferromagnetic alloy 14 having the L1$_0$ structure of each of Examples 1 and 2 and Comparative Examples 1 and 2 is formed while the substrate is heated to 400° C. FIGS. 3 to 6 illustrate the results of measurements of the magnetization curves (MH loops) of Examples 1 and 2 and Comparative Examples 1 and 2 performed by a vibrating sample magnetometer. Referring to FIGS. 3 to 6, the abscissa indicates the applied magnetic field (kOe), and the ordinate indicates the magnetic moment (emu/cm$^2$). In each of FIGS. 3 to 6, the solid line is an MH loop in the direction of easy magnetization obtained by applying a magnetic field in a direction (perp.) perpendicular to the film surface, and the broken line is an MH loop in the direction of hard magnetization obtained by applying a magnetic field in a direction (in-plane) parallel to the film surface.

In these stacked structures except for Comparative Example 1, a Co$_{40}$Fe$_{40}$B$_{20}$ film about 3 nm thick is formed as the underlying layer 21 in the underlying layer 13, so the MH loop of Co$_{40}$Fe$_{40}$B$_{20}$ as a magnetic material and that of FePtB as the ferromagnetic alloy 14 having the L1$_0$ structure overlap each other to form one MH loop. The MH loops will be described by taking this into consideration. When the magnetic field is 0, the magnetic moment of the MH loop in the direction of easy magnetization is larger than that of the MH loop in the direction of hard magnetization in each arrangement. Therefore, the film is a perpendicular magnetization film in which the direction perpendicular to the film surface is the axis of easy magnetization. In the view of the MH loops in the direction of hard magnetization, the MH loop of Example 1 has a smallest hysteresis, and the hysteresis significantly appears in the order of Example 2, Comparative Example 2, and Comparative Example 1. When the hysteresis appears in the MH loop in the direction of hard magnetization, one possible cause is the dispersion of the axis of easy magnetization.

FIG. 7 shows the X-ray diffraction profiles of Examples 1 and 2 and Comparative Examples 1 and 2. Referring to FIG. 7, the abscissa indicates a diffraction angle 2θ (deg.), and the ordinate indicates the diffraction intensity (arb. unit). In each profile as shown in FIG. 7, a diffraction peak of the (001) plane as an ordered structure indicating the L1$_0$ structure is detected, and no diffraction peak resulting of the L1$_0$ structure is detected except that a diffraction peak of the (002) plane as a disordered structure is detected. That is, the (001) plane orients in each sample.

When the rocking curve of the (001) plane was measured and the full width at half maximum of the rocking curve was analyzed, the values of Examples 1 and 2 were 4° to 5°, and those of Comparative Examples 1 and 2 were about 10°. These results demonstrate that the crystal orientation is favorable and the dispersion of the axis of easy magnetization is small in Examples 1 and 2, when compared to Comparative Examples 1 and 2. Also, a diffraction peak is observed near 41° in each of Examples 1 and 2. This diffraction peak is found to be the diffraction peak of TiN(200) by premeasuring the X-ray diffraction profile of a stacked structure in which no ferromagnetic alloy 14 having the L1$_0$ structure was formed. A predicted diffraction angle of TiN(200) is around 42°, so TiN(200) having a large lattice constant is presumably formed.

Large differences can also be confirmed from the transmission electron microscope images of Examples 1 and 2 and Comparative Examples 1 and 2. In Example 1, the grain growth of FePtB as the ferromagnetic alloy 14 having the L1$_0$ structure advances and the crystal grains of FePtB are large, compared to Comparative Examples 1 and 2. This coincides with the result that the diffraction intensity of Example 1 is highest in the X-ray diffraction profiles shown in FIG. 7. In Comparative Example 2, MgO of the underlying layer 22 cannot be confirmed as a layer, and the surface of FePtB as the ferromagnetic alloy 14 having the L1$_0$ structure formed on the underlying layer 13 is rough, i.e., the smoothness has significantly deteriorated. This shows that the smoothness deteriorates when a metal layer is directly formed on a thin oxide layer.

In Examples 1 and 2, a metal layer (the underlying layer 24 is Pt) as a buffer layer is formed on a nitride layer (the underlying layer 23 is TiN). In Comparative Example 1, all the underlying layers 21 to 23 are metal layers. In Comparative Example 1, the crystal grains of FePtB as the ferromagnetic alloy 14 having the L1$_0$ structure are smaller than those of Example 1 as described above, so undulation having a short period is observed with FePtB being formed. From the viewpoint of the smoothness, even this undulation having a short period makes it difficult to decrease the thickness of a tunnel barrier layer.

In Example 2 in which no MgO as the underlying layer 22 was formed between Co$_{40}$Fe$_{40}$B$_{20}$ as the underlying layer 21 and TiN as the underlying layer 23 unlike in Example 1, Co$_{40}$Fe$_{40}$B$_{20}$ as the underlying layer 21 aggregated in the heating step after the layer was formed. When forming layers on the underlying layer 23, this increases the surface roughness and deteriorates the smoothness. When implementing an MRAM, a resistance-area product RA must be decreased to a few 10 Ωμm$^2$, i.e., the film thickness of the tunnel barrier layer must be decreased to about 1 nm. Accordingly, the smoothness before the tunnel barrier layer is formed is very important, so the underlying layer 22 is preferably formed. When using the underlying layer 13 of Example 2, however, the heating step after Co$_{40}$Fe$_{40}$B$_{20}$ as the underlying layer 21 is formed is controlled so as to prevent aggregation of this Co$_{40}$Fe$_{40}$B$_{20}$.

Arrangement having no Pt as the underlying layer 24 were compared in Example 1 and Comparative Example 2. When no Pt as the underlying layer 24 is formed in Example 1, the MH loop in the direction of easy magnetization indicates that the coercive force of FePtB is smaller than that when Pt exists (Example 1). This result shows that ordering of FePtB progresses less than when Pt exists. As described previously, the comparison of the MH loops in the direction of hard magnetization indicates that the ferromagnetic alloy having the L1$_0$ structure in which the (001) plane orients is formed.

On the other hand, when no Pt as the underlying layer 24 is formed in Comparative Example 2, FePtB as a metal layer is directly formed on a thin oxide (MgO). This deteriorates the smoothness and makes the orientation of the (001) plane worse than that of Comparative Example 2. Accordingly, the smoothness and the orientation of the (001) plane improve more when FePtB is formed on TiN (a nitride) than when FePtB is formed on thin MgO (an oxide).

From the foregoing, the ferromagnetic alloy 14 having the L1$_0$ structure and superior in crystallinity, orientation of the (001) plane, and smoothness can be formed by using a nitride having the NaCl structure in the underlying layer 13. Also, to control the orientation and smoothness of this nitride, it is preferable to form, in the underlying layer 13, an amorphous layer or fine-crystal layer such as Co$_{40}$Fe$_{40}$B$_{20}$ as the underlying layer 21 and an oxide layer having the NaCl structure as the underlying layer 22.

Figure 8:
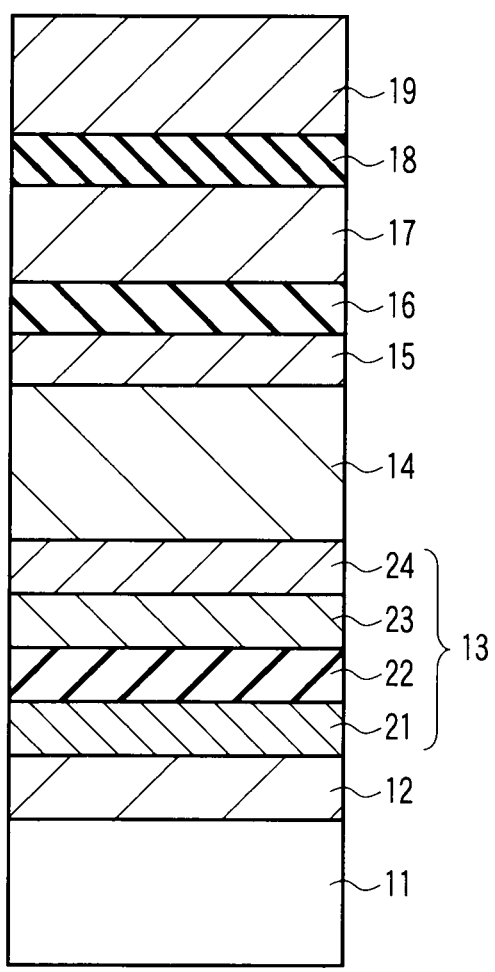
FIG. 8 is a sectional view illustrating an MTJ structure according to the first embodiment.

The present inventors also made extensive studies on an underlying layer for achieving a high MR ratio in an MTJ structure as shown in FIG. 8. This MTJ structure shown in FIG. 8 has an arrangement in which a Ta film about 5 nm thick as an adhesive layer 12 for an underlying layer 13 is formed on an Si substrate 11 with a thermal oxide film, and an FePtB film about 10 nm thick as a fixed layer 14 made of a ferromagnetic alloy having the $L1_0$ structure, a $Co_{40}Fe_{40}B_{20}$ film about 2 nm thick as an interface layer 15 that increases the MR ratio, an MgO film about 2 nm thick as a tunnel barrier layer 16, an FePt film about 3 nm thick as a recording layer 17, and an MgO film about 1 nm thick as a protective layer 18 are sequentially formed on the underlying layer 13.

FePtB of the fixed layer 14 is formed while the substrate is heated to 400° C. Also, FePt of the recording layer 17 is ordered by performing annealing in a vacuum at 400° C. for 2 hours after an Fe film about 1.5 nm thick and a Pt film about 1.5 nm thick are sequentially formed and MgO as the protective layer 18 is formed.

An underlying layer 13 according to Example 3 of the present invention has an arrangement in which a $Co_{40}Fe_{40}B_{20}$ film about 3 nm thick as an underlying layer 21, an MgO film about 0.5 nm thick as an underlying layer 22, a TiN film about 20 nm thick as an underlying layer 23, and a Pt film about 3 nm thick as an underlying layer 24 are sequentially formed.

An underlying layer 13 according to Example 4 of the present invention has an arrangement in which a $Co_{40}Fe_{40}B_{20}$ film about 3 nm thick as an underlying layer 21, a TiN film about 20 nm thick as an underlying layer 23, and a Pt film about 3 nm thick as an underlying layer 24 are sequentially formed without any underlying layer 22.

An underlying layer 13 according to Comparative Example 3 has the arrangement of reference 1 in which an NiTa film about 20 nm thick, a Cr film about 20 nm thick, and a Pt film about 5 nm thick are sequentially formed. That is, Comparative Example 3 has an arrangement in which NiTa, Cr, and Pt are sequentially formed as an underlying layer 21, underlying layers 22 and 23, and an underlying layer 24, respectively.

Figure 9:
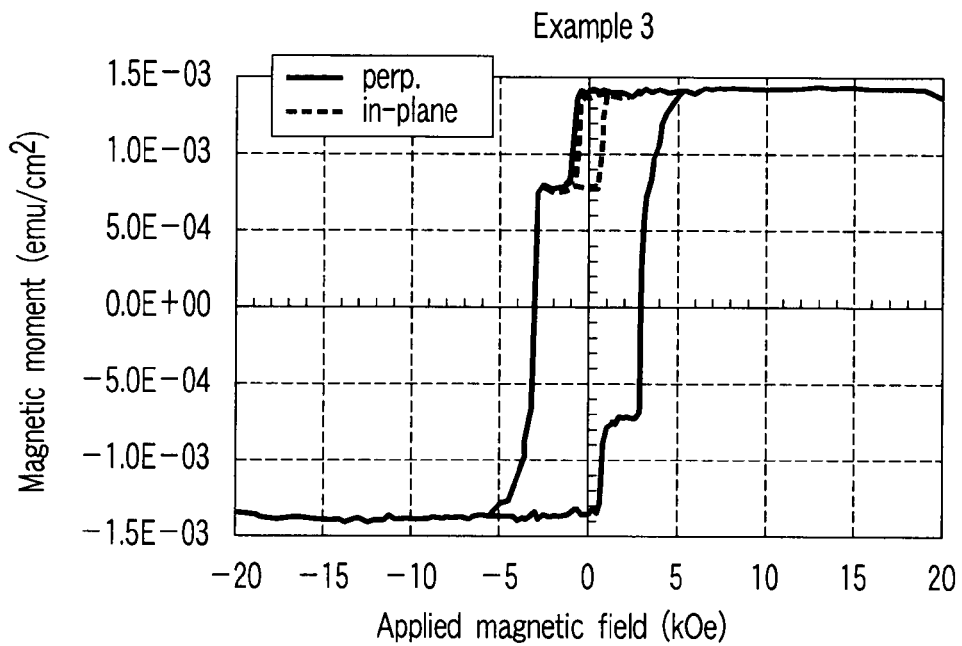
FIG. 9 is a graph illustrating MH loops according to Example 3.
Figure 10:
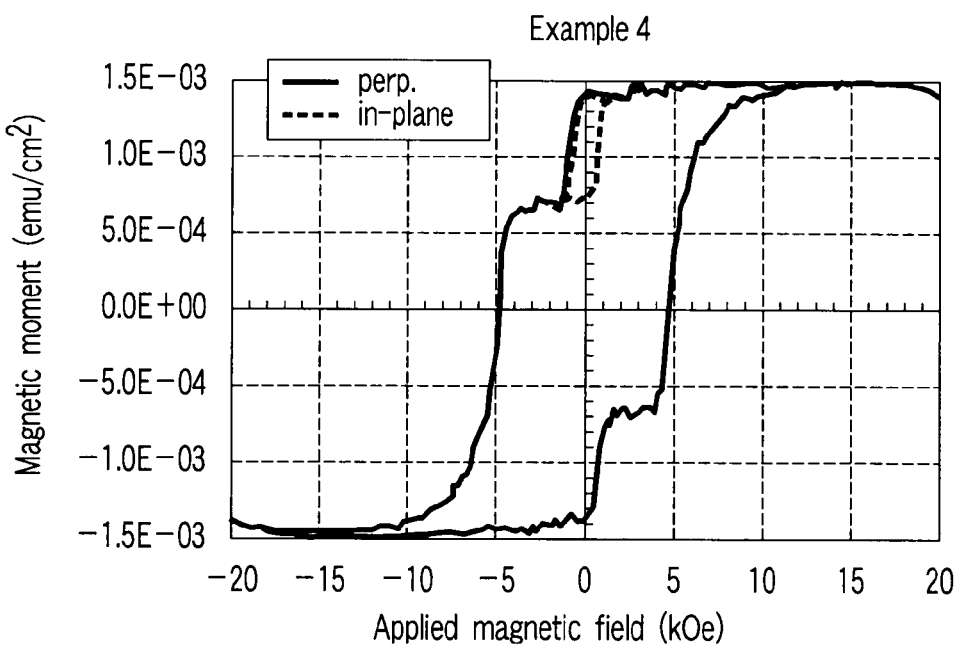
FIG. 10 is a graph illustrating MH loops according to Example 4.

In each of Examples 3 and 4 and Comparative Example 3, an Ru film about 7 nm thick is formed as an electrode 19 after the annealing process. FIGS. 9 to 11 show the MH loops of Examples 3 and 4 and Comparative Example 3. As shown in FIGS. 9 to 11, clear coercive force difference type loops can be observed.

When a resistance-area product RA and MR ratio were measured, the results were that Example 3: RA 10 k$\Omega\mu m^2$ and MR ratio=80%, Example 4: RA=10 k$\Omega\mu m^2$ and MR ratio=80%, and Comparative Example 3: RA=10 k$\Omega\mu m^2$ and MR ratio=55%. The MR ratio of Comparative Example 3 was lower than those of Examples 3 and 4 because Cr diffused to the MgO interface by substrate heating and the heating step of annealing. That is, in Examples 3 and 4 using no Cr, it is possible to implement an MTJ structure having a high MR ratio.

Another cause is that undulation having a short period deteriorates the smoothness of FePtB of the fixed layer 14 in Comparative Example 3. In each of Examples 3 and 4, the roughness has a long period with FePtB of the fixed layer 14 being formed, compared to Comparative Example 3. This improves the smoothness with $Co_{40}Fe_{40}B_{20}$ of the interface layer 15 being formed. Consequently, Examples 3 and 4 can achieve a high MR ratio.

When Example 3 is compared with Example 4, $Co_{40}Fe_{40}B_{20}$ as the underlying layer 21 aggregates in the heating step after $Co_{40}Fe_{40}B_{20}$ is formed in Example 4, so the smoothness of the fixed layer 14 is inferior to that in Example 3. However, the same MR ratio as that of Example 3 is achieved in Example 4 because the thickness of MgO of the tunnel barrier layer 16 is relatively thick, i.e., about 2 nm. If the thickness of the tunnel barrier layer 16 is decreased in this state, however, the MR ratio decreases with the decrease in thickness faster in Example 4 than in Example 3.

From the foregoing, in the underlying layer of Comparative Example 3, the MR ratio decreases by the diffusion of Cr forming the underlying layer. Accordingly, a high MR ratio can be achieved by the underlying layers of Examples 3 and 4. Also, in Examples 3 and 4, the smoothness of FePtB of the fixed layer 14 improves. As a consequence, an MR ratio higher than that of Comparative Example 3 can be achieved.

[1-2] Materials of Underlying Layer 13

In the underlying layer 13, a nitride having the NaCl structure is used as the underlying layer 23. A nitride having the NaCl structure is conductive and highly crystalline, and hence is suitable as a material to be used in the underlying layer.

Examples of the material of the underlying layer 23 other than TiN are ZrN, NbN, and VN. Even when any of these nitrides is used as the underlying layer 23, the same results as those of the above examples can be obtained for both the magnetic characteristic and MR ratio. Similar to TiN, each of ZrN, NbN, and VN is a nitride having the NaCl structure. A nitride having the NaCl structure may also be, e.g., Ti—Zr—N or Ti—Al—N having two metal elements, instead of, e.g., TiN having one metal element. As the underlying layer 23, it is also possible to use a nitride of, e.g., Hf, Ta, Mo, W, B, Al, or Ce, instead of a nitride of Ti, Zr, Nb, or V.

The lower standard free energy of formation of a nitride, the more stably the nitride can exist. When representative nitrides having the NaCl structure are arranged in ascending order of standard free energy of formation at 500° C., the order is ZrN, TiN, CeN, VN, and CrN ("Metal Data Book" edited by Japan Metal Society, p. 90). If a nitride cannot stably exist, some elements forming the nitride may diffuse in heating steps before and after the nitride is formed. Therefore, the standard energy of formation of a nitride used in this embodiment is preferably as low as possible. From this point of view, ZrN, TiN, and CeN are more favorable.

Also, the lattice constants of the a axis of FePt, FePd, and CoPt as representative $L1_0$ structures are respectively 3.846, 3.86, and 3.82 Å. The lattice constants of ZrN, TiN, and CeN as nitrides having the NaCl structure described above are respectively 4.537, 4.215, and 5.02 Å. From the viewpoint of the lattice constant, TiN, ZrN, and CeN are favorable in this order. Furthermore, if the film thickness of a nitride as the underlying layer 23 is too large, the smoothness worsens, and if it is too small, the underlying layer 23 does not function as a nitride. Therefore, the film thickness of a nitride is preferably 3 to 30 nm.

In the underlying layer 13, an amorphous layer or finecrystal layer is used as the underlying layer 21 in order to improve the smoothness and the crystallinity and orientation of an oxide or nitride having the NaCl structure as the underlying layer 23. An example of the underlying layer 21 having an amorphous structure (or fine-crystal structure) is a metal containing one or more elements selected from iron (Fe), cobalt (Co), and nickel (Ni), and one or more elements selected from boron (B), niobium (Nb), silicon (Si), tantalum (Ta), and zirconium (Zr).

Practical examples are amorphous layers (or fine-crystal layers) made of $Co_{80}B_{20}$ and $Fe_{80}Si_{10}B_{10}$, in addition to $Co_{40}Fe_{40}B_{20}$ used in the above examples. CoZrB, NiSiB, FeNiSiB, and FeCoZrB are also favorable materials. Even when any of these amorphous layers is used as the underlying layer 21, the same results as in each of the above examples can be obtained for both the magnetic characteristic and MR ratio. The fine-crystal layer is made of crystal grains each having several nm of grain size (for example, 2 to 3 nm of mean grain sizes).

Each of these amorphous layers (or fine-crystal layers) may also partially start crystallizing by the heating step after film formation and exhibit a clear crystal structure in a certain region, although the layer does not show any clear crystal structure when formed. That is, each amorphous layer may also exhibit a crystal structure when finally functioning as a device. When an amorphous layer is thus used as the underlying layer 21 and an oxide and nitride having the NaCl structure are formed on this amorphous layer, the (100) plane readily orients in the oxide and nitride.

Furthermore, if the film thickness of an amorphous layer as the underlying layer 21 is too large, film formation takes a long time, and this decreases the productivity. On the other hand, if this film thickness is too small, the underlying layer 21 cannot function as a layer for arranging the orientation of the material having the NaCl structure. Therefore, the film thickness is preferably 1 to 10 nm.

In the underlying layer 13, the underlying layer 24 is preferably made of a metal having the tetragonal structure or cubic structure, having a lattice constant of 2.7 to 3.0 Å or 3.7 to 4.2 Å, and orienting in the (001) plane. The orientation of an ordered alloy as the fixed layer 14 made of a ferromagnetic alloy having the $L1_0$ structure can be further improved by forming the underlying layer 24 as a buffer layer between a nitride as the underlying layer 23 and the ordered alloy, rather than by directly forming the ordered alloy on the nitride.

More specifically, the underlying layer 24 is preferably made of one element selected from rhodium (Rh), iridium (Ir), palladium (Pd), platinum (Pt), copper (Cu), silver (Ag), and gold (Au), or an alloy mainly containing one of these elements. If the film thickness of a metal layer as the underlying layer 24 is too large, the smoothness worsens, and if it is too small, the underlying layer 24 cannot function well as a layer for arranging the orientation of an ordered alloy having the $L1_0$ structure. Accordingly, this film thickness is favorably 1 to 10 nm.

A case where the ferromagnetic alloy 14 having the $L1_0$ structure is arranged as a recording layer on the underlying layer 13 will be considered. This arrangement is the so-called bottom free (top pin) structure, in which a recording layer is arranged on the substrate side. A recording layer, in some cases, increase its damping constant depending on the material to which it contact, and this phenomenon is called the spin pumping effect. (See, for example, Spintronics by Terunobu Miyazaki, Nikkan Kogyo Shimbun, Ltd.) Since the switching current is proportional to the damping constant, it is desirable in order to have a low current that the damping constant should be low. Here, it is understood as a theorem that when the spin relaxation of the material being in contact with the recording layer (ferromagnetic layer) is large, the increase in the damping constant of the recording layer is large, whereas when the spin relaxation is small, the increase in the damping constant is large. Of the elements mentioned above, platinum (Pt) and palladium (Pd) each have a large spin relaxation, and they increase the damping constant, and therefore the other elements should be desirably used. Copper (Cu) and gold (Au) each have a small spin relaxation, and therefore copper (Cu), gold (Au) or a Cu—Au alloy should be desirably used as the underlying layer 24. It should be noted that when an element having a large spin relaxation, such as platinum (Pt) or palladium (Pd), is used, it is desirable that the film should be made as thin as possible.

Further, in terms of the spin pumping, it is considered that the increase in damping constant can be suppressed by using a conductive oxide, not a metal. Examples of the conductive oxide are $SrRuO_3$, $Sr(Ti,Ru)O_3$ and $LaNbO_3$, which has the perovskite structure. Here, when a general formula of a simple perovskite-type compound is expressed by $ABO_3$, "A" is a divalent alkaline earth element or trivalent rare earth element, and "B" is a trivalent or quadrivalent transition metal element. In each of these conductive oxides, a conductive band is formed by hybridization of d orbital of site B element and 2p orbital of oxygen. In general, these oxides change their electro-conductivities depending on the oxygen deficiency amount. "A" represents calcium (Ca), strontium (Sr), barium (Ba), lanthanum (La), etc., whereas "B" represents titanium (Ti), vanadium (V), chromium (Cr), manganese (Mn), iron (Fe), cobalt (Co), nickel (Ni), niobium (Nb), molybdenum (Mo), ruthenium (Ru), iridium (Ir), lead (Pb), etc. In other words, examples of these oxides are $SrRuO_3$, $Sr(Ti,Ru)O_3$, $SrNbO_3$, $Sr(Ti,V)O_3$, $LaTiO_3$, $CaVO_3$, $SrVO_3$, $BaVO_3$, $CaCrO_3$, $SrCrO_3$, $La_{1-x}Sr_xMnO_3$, $SrFeO_3$, $SrCoO_3$, $La_{1-x}Sr_xCoO_3$, $LaNiO_3$, $SrNbO_3$, $CaMoO_3$, $SrMoO_3$, $BaMoO_3$, $CaRuO_3$, $SrIrO_3$, $BaPbO_3$. "x" is 0 to 1. The oxide can be selected from these appropriately in consideration of the high heat resistance and low lattice mismatching.

As described above, it is necessary to satisfy a low electro-resistance in the underlying layer. In the case where a perevskite-type oxide is used as the underlying layer, it is preferable that a material with a lowest possible resistivity should be employed. In the case in which the resistivity is about 1 mΩcm, supposing that the layer is processed into a columnar shape having a diameter of 30 nm and the thickness thereof is about 20 nm, the resistance is about less than 300Ω, which is significantly lower than the resistance of the barrier layer.

It is possible to form the recording layer 14 on such a conductive oxide having a perovskite structure, or also possible to further form a metal layer as the underlying layer between these layers. Note that as described above, in order to avoid the increase in damping by spin pumping, the layer should desirably be as thin as possible, preferably about 1 nm or less.

In the underlying layer 13, an oxide having the NaCl structure is used as the underlying layer 22 in order to improve the smoothness, crystallinity, and orientation of layers above the underlying layer 22. An example of an oxide having the NaCl structure is a material mainly containing at least one element selected from magnesium (Mg), calcium (Ca), vanadium (V), niobium (Nb), manganese (Mn), iron (Fe), Cobalt (Co), and nickel (Ni). If the film thickness of an oxide as the underlying layer 22 is too large, the resistance rises, and a series resistance is added to decrease the magnetoresistive ratio generated in the tunnel barrier layer. Therefore, the resistance must be lower than at least the resistance of the barrier layer. For this purpose, the film thickness is desirably smaller than 1 nm.

[1-3] Materials of Ferromagnetic Alloy 14 Having $L1_0$ Structure

When a fixed layer is formed on the substrate side in an MTJ (Magnetic Tunnel Junction) element having a single-pin structure in which a recording layer and the fixed layer are stacked with a nonmagnetic layer being interposed between them, the ferromagnetic alloy 14 having the $L1_0$ structure corresponds to the fixed layer. When the recording layer is formed on the substrate side, the ferromagnetic alloy 14 having the $L1_0$ structure corresponds to the recording layer.

This ordered alloy contains one or more elements selected from iron (Fe), cobalt (Co), nickel (Ni), and copper (Cu), and one or more elements selected from palladium (Pd), platinum (Pt), and gold (Au). Examples are $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, $Co_{30}Ni_{20}Pt_{50}$, $Fe_{40}Cu_{10}Pt_{50}$, $Fe_{50}Pt_{25}Pd_{25}$, and $Fe_{50}Pt_{45}AuS$. Note that these ordered alloys are not limited to the above composition ratios.

These ordered alloys may also contain at least one element selected from boron (B), zirconium (Zr), and silver (Ag) at a total concentration of 20 at % or less. "at %" represents the atomic (number) percent. Note that if the content of a nonmagnetic element is higher than 20 at %, the perpendicular magnetic anisotropy of the ferromagnetic alloy 14 having the $L1_0$ structure undesirably deteriorates.

The ferromagnetic alloy 14 having the $L1_0$ structure may also have a granular structure. The ferromagnetic alloy 14 having the $L1_0$ structure and granular structure is obtained by adding an oxide or nitride of one or more elements selected from magnesium (Mg), calcium (Ca), boron (B), aluminum (Al), silicon (Si), iron (Fe), cobalt (Co), nickel (Ni), titanium (Ti), zirconium (Zr), hafnium (Hf), vanadium (V), niobium (Nb), tantalum (Ta), chromium (Cr), molybdenum (Mo), and tungsten (W) at a concentration of 20 vol % or less to an ordered alloy containing at least one element selected from iron (Fe), cobalt (Co), nickel (Ni), and copper (Cu), and at least one element selected from palladium (Pd), platinum (Pt), and gold (Au). The "vol %" represents the volume percent. Note that if the content of an oxide or nitride is higher than 20 vol %, the perpendicular magnetic anisotropy of the ferromagnetic alloy 14 having the $L1_0$ structure undesirably deteriorates.

[2] Magnetoresistive Element

MTJ Element

An MTJ (Magnetic Tunnel Junction) element 10 to be used in a memory or the like can be formed by using the underlying layer 13 and ordered alloy (fixed layer 14) described above. Embodiments in which the underlying layer 13 and ordered alloy (fixed layer 14) are applied to the MTJ element will be explained below.

[2-1] Single-Pin Structure

FIG. 12 is a schematic view of the MTJ element 10 having a single-pin structure according to the first embodiment. The arrows in FIG. 12 indicate the magnetization directions. Note that the single-pin structure is a structure in which a recording layer and fixed layer are stacked with a nonmagnetic layer being interposed between them.

As shown in FIG. 12, the MTJ element 10 has a stacked structure including a fixed layer (also called a pinned layer) 14 made of a magnetic material, a recording layer (also called a free layer) 17 made of a magnetic material, and a nonmagnetic layer 16 sandwiched between the fixed layer 14 and recording layer 17. The MTJ element 10 is a so-called perpendicular magnetization type element in which the fixed layer 14 and recording layer 17 have perpendicular magnetic anisotropy, and the magnetization directions in the fixed layer 14 and recording layer 17 are perpendicular to the film surfaces. Also, the magnetization (or spin) direction is invariable (fixed) in the fixed layer 14. In the recording layer 17, the magnetization direction is variable (changeable). "The magnetization direction in the fixed layer 14 is invariable" means that the magnetization direction in the fixed layer 14 remains unchanged when a magnetization switching current used to switch the magnetization direction in the recording layer 17 is supplied to the fixed layer 14.

The MTJ element 10 having a high performance can be implemented by using a magnetic layer having a large magnetization switching current as the fixed layer 14, and a magnetic layer having a switching current smaller than that of the fixed layer 14 as the recording layer 17. When reversing (switching) magnetization by using a spin-polarized current, the switching current is proportional to the saturation magnetization, anisotropic magnetic field, and volume. Therefore, it is possible to produce a difference between the switching currents of the recording layer 17 and fixed layer 14 by properly adjusting these factors. Also, to achieve perpendicular magnetization by the recording layer 17 and fixed layer 14, a material having a magnetocrystalline anisotropic energy density of $5 \times 10^5$ erg/cc or more is desirable.

The MTJ element 10 has the TMR (Tunneling Magnetoresistive) effect when the nonmagnetic layer 16 is an insulator, and the GMR (Giant Magnetoresistive) effect when the nonmagnetic layer 16 is a metal. When the nonmagnetic layer 16 is an insulator, it is possible to use, e.g., magnesium oxide (MgO) or aluminum oxide ($AlO_x$). When the nonmagnetic layer 16 is a metal, it is possible to use, e.g., gold (Au), silver (Ag), copper (Cu), or an alloy mainly containing at least one of these elements.

(Operation)

The MTJ element 10 is a spin transfer torque writing type magnetoresistive element. Accordingly, when writing data in the MTJ element 10 or reading data from the MTJ element 10, a current is supplied to the MTJ element 10 in two directions perpendicular to the film surfaces (or stacked surfaces). Also, in the MTJ element 10, the magnetization directions in the two magnetic layers (the recording layer 17 and fixed layer 14) take a parallel arrangement or antiparallel arrangement. Information "0" or "1" is made to correspond to that resistance value of the MTJ element 10, which changes in accordance with the magnetization arrangement. In this way, the MTJ element 10 can be used as a memory element.

More specifically, when supplying electrons from the fixed layer 14 (i.e., when supplying electrons from the fixed layer 14 to the recording layer 17), electrons spin-polarized in the same direction as the magnetization direction in the fixed layer 14 are injected into the recording layer 17. In this case, the magnetization direction in the recording layer 17 is made equal to that in the fixed layer 14. Consequently, the magnetization directions in the fixed layer 14 and recording layer 17 take the parallel arrangement. In this parallel arrangement, the resistance value of the MTJ element 10 is smallest. This state is defined as, e.g., data "0".

On the other hand, when supplying electrons from the recording layer 17 (i.e., when supplying electrons from the recording layer 17 to the fixed layer 14), electrons spin-polarized in a direction opposite to the magnetization direction in the fixed layer 14 are injected into the recording layer 17. In this case, the magnetization direction in the recording layer 17 is made opposite to that in the fixed layer 14. Consequently, the magnetization directions in the fixed layer 14 and recording layer 17 take the antiparallel arrangement. In this antiparallel arrangement, the resistance value of the MTJ element 10 is largest. This state is defined as, e.g., data "1".

Practical examples of the MTJ element 10 having the single-pin structure will be explained below.

(a) Practical Example 1-1

Figure 13:
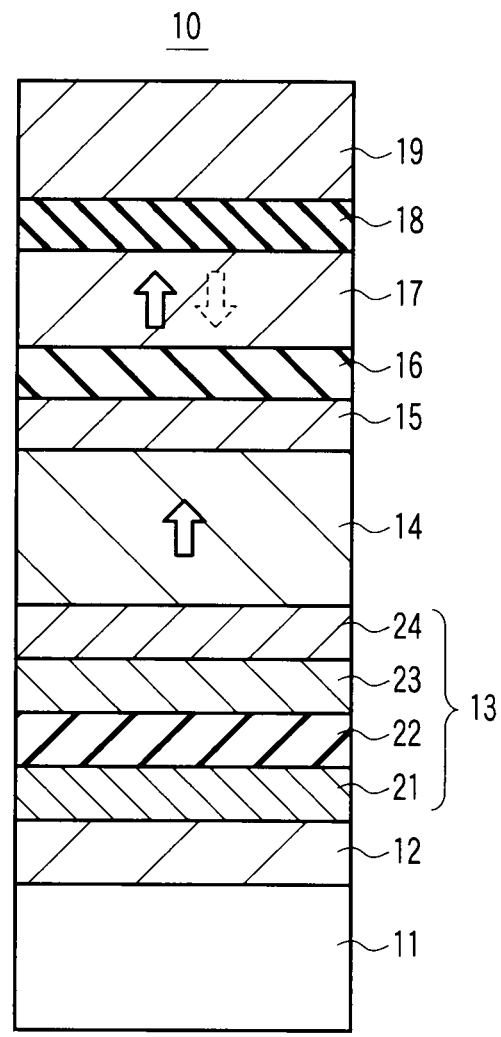
FIG. 13 is a sectional view illustrating the arrangement of an MTJ element 10 of Practical Example 1-1.

An MTJ element 10 of Practical Example 1-1 is the same as that of Example 3 described earlier. FIG. 13 is a sectional view illustrating the arrangement of the MTJ element 10 of Practical Example 1-1. In the MTJ element 10 of Practical Example 1-1, a fixed layer 14 and recording layer 17 are each made of a ferromagnetic alloy (ordered alloy) having the $L1_0$ structure and orienting in the (001) plane. The materials described in Section [1-3] are used in this ordered alloy. An example of the MTJ element 10 of Practical Example 1-1 will be explained below.

As shown in FIG. 13, the MTJ element 10 has an arrangement in which a Ta film about 10 nm thick is formed as an adhesive layer 12 for an underlying layer 13 is formed on an Si substrate 11 with a thermal oxide film, and an FePtB film about 10 nm thick as a fixed layer 14, a $Co_{40}Fe_{40}B_{20}$ film about 2 nm thick as an interface layer 15 for increasing the MR ratio, an MgO film about 2 nm thick as a tunnel barrier layer 16, an FePt film about 3 nm thick as a recording layer 17, and an MgO film about 1 nm thick as a protective layer 18 are sequentially formed on the underlying layer 13. Ta of the adhesive layer 12 also functions as a lower electrode.

FePtB of the fixed layer 14 is formed while the substrate is heated to 400° C. Also, FePt of the recording layer 17 is ordered by performing annealing at 400° C. for 2 hours after an Fe film about 1.5 nm thick and a Pt film about 1.5 nm thick are sequentially formed and MgO of the protective layer 18 is formed. After the annealing process, an Ru film about 5 nm thick as an upper electrode 19 and a Ta film about 100 nm thick are sequentially formed. The underlying layer 13 has an arrangement in which a $Co_{40}Fe_{40}B_{20}$ film about 3 nm thick as an underlying layer 21, an MgO film about 0.5 nm thick as an underlying layer 22, a TiN film about 20 nm thick as an underlying layer 23, and a Pt film about 3 nm thick as an underlying layer 24 are sequentially formed.

Practical Example 1-1 as described above can achieve a high MR ratio because the (100) plane orients in MgO of the tunnel barrier layer 16. The coercive force and saturation magnetization of Practical Example 1-1 were measured by using a vibrating sample magnetometer. Consequently, the fixed layer 14 had a coercive force of 6 kOe and a saturation magnetization of 850 emu/cc, and the recording layer 17 had a coercive force of 700 Oe and a saturation magnetization of 1,000 emu/cc. Note that the fixed layer 14 and interface layer 15 behave as one magnetic layer because they are coupled by exchange coupling. Therefore, the coercive force and saturation magnetization described above are the values obtained by regarding the fixed layer 14 and interlayer layer 15 as one magnetic layer. The MR ratio of the MTJ element 10 was 80%.

The arrangement of Practical Example 1-1 has a so-called bottom pin structure in which the fixed layer 14 is formed below the tunnel barrier layer 16 (on the substrate side), and the recording layer 17 is formed above the tunnel barrier layer 16. The arrangement of Practical Example 1-1 may also have a so-called top pin structure in which the fixed layer 14 is formed above the tunnel barrier layer 16, and the recording layer 17 is formed below the tunnel barrier layer 16 (on the substrate side). That is, in Practical Example 1-1, an FePtB film about 2 nm thick is formed as the recording layer 17 in the position of the fixed layer 14, and a $Co_{40}Fe_{40}B_{20}$ film about 1 nm thick is formed as the interface layer 15. The thickness of $Co_{40}Fe_{40}B_{20}$ of the interface layer 15 is set at 1 nm because perpendicular magnetization cannot be maintained if a 2-nm thick $Co_{40}Fe_{40}B_{20}$ film is formed and coupled by exchange coupling with the 2-nm thick FePtB film. In the position of the recording layer 17, an FePtB film about 10 nm thick is formed as the fixed layer 14.

In both the bottom pin structure and top pin structure, an antiferromagnetic layer may also be formed adjacent to the fixed layer 14 in order to fix magnetization in the fixed layer 14 in one direction. As this antiferromagnetic layer, it is possible to use, e.g., FeMn, NiMn, PtMn, PtPdMn, RuMn, OsMn, or IrMn as an alloy of manganese (Mn) and iron (Fe), nickel (Ni), platinum (Pt), palladium (Pd), ruthenium (Ru), osmium (Os), or iridium (Ir).

(b) Practical Example 1-2

An MTJ element 10 of Practical Example 1-2 has the same arrangement as that of Practical Example 1-1 except that a recording layer 17 of Practical Example 1-1 has an artificial lattice and a protective layer 18 is made of Pd accordingly.

As the artificial lattice, it is possible to use a structure obtained by alternately stacking one or more elements selected from iron (Fe), cobalt (Co), and nickel (Ni) or an alloy containing one of these elements, and one element selected from chromium (Cr), platinum (Pt), palladium (Pd), iridium (Ir), rhodium (Rh), ruthenium (Ru), osmium (Os), rhenium (Re), gold (Au), and copper (Cu) or an alloy containing one of these elements. Examples of the artificial lattice are Co/Pt, Co/Pd, CoCr/Pt, Co/Ru, Co/Os, Co/Au, and Ni/Cu. Also, the magnetic anisotropic energy density and saturation magnetization can be adjusted by adding a nonmagnetic metal such as Cu to the magnetic material forming the artificial lattice. It is also possible to adjust the magnetic anisotropic energy density and saturation magnetization by adjusting the film thickness ratio of the magnetic layer to the nonmagnetic layer.

An example of the MTJ element 10 of Practical Example 1-2 will be explained below. The recording layer 17 is made of an artificial lattice obtained by sequentially forming a $Co_{60}Fe_{20}B_{20}$ film about 1.0 nm thick and Pd film about 0.7 nm thick, and stacking two cycles of a $Co_{50}Fe_{50}$ film about 0.3 nm thick and Pd film about 1 nm thick. The protective layer 18 is made of a Pd film about 3 nm thick. In Practical Example 1-2, no annealing is performed in a vacuum at 400° C. for 2 hours because the recording layer 17 is not an ordered alloy having the $L1_0$ structure.

The coercive force and saturation magnetization of the recording layer 17 of the MTJ element 10 according to Practical Example 1-2 as described above were respectively 300 Oe and 500 emu/cc when measured by a vibrating sample magnetometer. The MR ratio of the MTJ element 10 was 60%.

Note that aluminum oxide ($AlO_x$) may also be used as a tunnel barrier layer 16. It is also possible to form an antiferromagnetic layer adjacent to a fixed layer 14 in order to fix the magnetization direction in the fixed layer 14.

(c) Practical Example 1-3

An MTJ element 10 of Practical Example 1-3 has the same arrangement as that of Practical Example 1-1 except that a recording layer 17 is a ferrimagnetic material, and a protective layer 18 is obtained by sequentially forming Ru and Ta.

As the recording layer 17, a ferrimagnetic material made of an alloy containing a rare earth metal and transition metal is used. More specifically, an amorphous alloy containing terbium (Tb), dysprosium (Dy), or gadolinium (Gd) and one or more transition metals is used. Examples of this ferrimagnetic material are TbFe, TbCo, TbFeCo, DyTbFeCo, and GdTbCo. The magnetic anisotropic energy density and saturation magnetization of any of these alloys can be adjusted by adjusting the composition of the alloy.

An example of the MTJ element 10 of Practical Example 1-3 will be explained below. The recording layer 17 is obtained by sequentially forming a $Co_{40}Fe_{40}B_{20}$ film about 1 nm thick and $Tb_{24}(Co_{80}Fe_{20})_{76}$ film about 5 nm thick. The protective layer 18 is obtained by sequentially forming an Ru film about 3 nm thick and Ta film about 5 nm thick. In Practical Example 1-3, no annealing is performed in a vacuum at 400° C. for 2 hours because the recording layer 17 is not an ordered alloy having the $L1_0$ structure.

The coercive force and saturation magnetization of the recording layer 17 of the MTJ element 10 according to Practical Example 1-3 as described above were respectively 2.0 kOe and 300 emu/cc when measured by a vibrating sample magnetometer. Note that $Co_{40}Fe_{40}B_{20}$ and $Tb_{24}(Co_{80}Fe_{20})_{76}$ of the recording layer 17 behave as one magnetic layer because they are coupled by exchange coupling. Therefore, the coercive force and saturation magnetization described above are the values obtained by regarding them as one magnetic layer. The MR ratio of the MTJ element 10 was 80%.

Note that aluminum oxide ($AlO_x$) may also be used as a tunnel barrier layer 16. It is also possible to form an antiferromagnetic layer adjacent to a fixed layer 14 in order to fix the magnetization direction in the fixed layer 14.

A random alloy may also be used as the recording layer 17. The random alloy mainly contains cobalt (Co), and also contains one or more elements selected from chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). Examples are CoCr, CoPt, CoCrTa, CoCrPt, CoCrPtTa, and CoCrNb. The magnetic anisotropic energy density and saturation magnetization of any of these alloys can be adjusted by increasing the ratio of the nonmagnetic element.

[2-2] Dual-Pin Structure

FIG. 14 is a schematic view of the MTJ element 10 having a dual-pin structure according to the first embodiment. Note that the dual-pin structure is a structure in which two fixed layers are formed on the two sides of a recording layer with nonmagnetic layers being interposed between them.

As shown in FIG. 14, the MTJ element 10 has a stacked structure including a recording layer 17 made of a magnetic material, first and second fixed layers 14 and 33 made of a magnetic material, a nonmagnetic layer 16 sandwiched between the recording layer 17 and first fixed layer 14, and a nonmagnetic layer 31 sandwiched between the recording layer 17 and second fixed layer 33. The MTJ element 10 is a so-called perpendicular magnetization type element in which the magnetization directions in the fixed layers 14 and 33 and recording layer 17 are perpendicular to the film surfaces. The first and second fixed layers 14 and 33 take the antiparallel arrangement in which the magnetization directions are opposite to each other.

The nonmagnetic layers 16 and 31 are made of an insulator such as magnesium oxide (MgO) or aluminum oxide ($AlO_x$), a metal such as gold (Au), silver (Ag), or copper (Cu), or an alloy mainly containing at least one of these elements.

In the MTJ element 10 having the dual-pin structure, the two magnetic layers (the recording layer 17 and fixed layer 14) sandwiching the nonmagnetic layer 16 and the two magnetic layers (the recording layer 17 and fixed layer 33) sandwiching the nonmagnetic layer 31 take the parallel or antiparallel arrangement. In the whole MTJ element 10, however, the parallel and antiparallel arrangements exist at the same time. This makes it necessary to produce a difference between the MR ratios obtained via the nonmagnetic layers 16 and 31.

Accordingly, when the nonmagnetic layer 16 is a tunnel barrier layer and the nonmagnetic layer 31 is made of a metal, the MR ratio generated in the tunnel barrier layer 16 is higher than that generated in the nonmagnetic layer 31. Therefore, the magnetization arrangement of the two magnetic layers (the recording layer 17 and fixed layer 14) sandwiching the tunnel barrier layer 16 is made to correspond to information "0" or "1".

(Operation)

The operation of the MTJ element 10 having the dual-pin structure will be explained below. When writing data in the MTJ element 10 or reading data from the MTJ element 10, a current is supplied to the MTJ element 10 in two directions perpendicular to the film surfaces (or stacked surfaces).

When supplying electrons from the fixed layer 14 (i.e., when supplying electrons from the fixed layer 14 to the recording layer 17), electrons spin-polarized in the same direction as the magnetization direction in the fixed layer 14 and electrons spin-polarized in a direction opposite to the magnetization direction in the fixed layer 33 as they are reflected by the fixed layer 33 are injected into the recording layer 17. In this case, the magnetization direction in the recording layer 17 is made equal to that in the fixed layer 14. Consequently, the magnetization directions in the fixed layer 14 and recording layer 17 take the parallel arrangement. In this parallel arrangement, the resistance value of the MTJ element 10 is smallest. This state is defined as, e.g., data "0".

On the other hand, when supplying electrons from the fixed layer 33 (i.e., when supplying electrons from the fixed layer 33 to the recording layer 17), electrons spin-polarized in the same direction as the magnetization direction in the fixed layer 33 and electrons spin-polarized in a direction opposite to the magnetization direction in the fixed layer 14 as they are reflected by the fixed layer 14 are injected into the recording layer 17. In this case, the magnetization direction in the recording layer 17 is made opposite to that in the fixed layer 14. In this antiparallel arrangement, the resistance value of the MTJ element 10 is largest. This state is defined as, e.g., data "1".

As described above, when the MTJ element 10 has the dual-pin structure in which the fixed layers 14 and 33 are formed on the two sides of the recording layer 17, it is possible to more efficiently use the effect of reflection of the spin-polarized electrons. As a consequence, the magnetization switching current can be reduced more than in the single-pin structure.

Practical examples of the MTJ element 10 having the dual-pin structure will be explained below.

(a) Practical Example 2-1

FIG. 15 is a sectional view illustrating the arrangement of an MTJ element 10 of Practical Example 2-1. In the MTJ element 10 of Practical Example 2-1, both fixed layers 14 and 33 formed on the two sides of a recording layer 17 have a single-layered structure, and are made of a ferromagnetic alloy having the $L1_0$ structure. An example of the MTJ element 10 of Practical Example 2-1 will be explained below.

The arrangement from a substrate 11 to the recording layer 17 is the same as that of Practical Example 1-1. After being formed, the recording layer 17 is ordered into the $L1_0$ structure by performing annealing in a vacuum at 400° C. for 2 hours in a film formation apparatus without exposure to the atmosphere. After this annealing process, an Au film about 5 nm thick as a spacer layer 31, an Fe film about 2 nm thick as an interface layer 32, an FePt film about 10 nm thick as a fixed layer 33, an Ru film about 5 nm thick as an electrode 19, and a Ta film about 100 nm thick are sequentially formed.

The coercive force of the fixed layer 33 is larger than that of the fixed layer 14, and the magnetization directions in the fixed layers 14 and 33 can be set antiparallel to each other by using this coercive force difference. That is, magnetization need only be performed twice. A first magnetic field application makes the magnetization direction in the fixed layer 14 and the magnetization directions in the recording layer 17 and fixed layer 33 equal. The fixed layer 14 and interface layer 15 behave as an integrated fixed layer because they are coupled by exchange coupling. This similarly applies to the fixed layer 33 and interface layer 32.

After that, a second magnetic field application is performed in a direction opposite to that of the first magnetic field application. The second applied magnetic field is set larger than the coercive force of the fixed layer 14 and interface layer 15 that behave as an integrated fixed layer, and smaller than the coercive force of the fixed layer 33 and interface layer 32. This makes the magnetization directions in the recording layer 17 and fixed layer 14 opposite to that in the fixed layer 33. In this manner, the magnetization arrangement as shown in FIG. 15 can be achieved.

In this arrangement, the change in magnetoresistance obtained via MgO of a tunnel barrier layer 16 is larger than that in magnetoresistance obtained via Au of the spacer layer 31. The MTJ element 10 stores information by the magnetization arrangement in the recording layer 17 and fixed layer 14, and that in the recording layer 17 and fixed layer 33. Note that a magnetic material having a high polarization ratio may also be formed as an interface layer in the interface between the recording layer 17 and tunnel barrier layer 16, and in the interface between the recording layer 17 and spacer layer 31. Note also that the spacer layer 31 may also be an insulating layer such as magnesium oxide (MgO) or aluminum oxide ($AlO_x$). In this case, no problem arises in the operation if the resistance and MR ratio of the spacer layer 31 are made lower than those of the tunnel barrier layer 16.

Note that antiferromagnetic layers may also be formed adjacent to the fixed layers 14 and 33 in order to fix the magnetization directions in these layers in one direction. As these antiferromagnetic layers, it is possible to use, e.g., FeMn, NiMn, PtMn, PtPdMn, RuMn, OsMn, or IrMn as an alloy of manganese (Mn) and iron (Fe), nickel (Ni), platinum (Pt), palladium (Pd), ruthenium (Ru), osmium (Os), or iridium (Ir).

Note also that each magnetic layer except for the fixed layer 14 can be appropriately selected from an ordered alloy, artificial lattice, ferrimagnetic material, and random alloy as described previously in Practical Examples 1-1 to 1-3.

(b) Practical Example 2-2

FIG. 16 is a sectional view illustrating the arrangement of an MTJ element 10 of Practical Example 2-2. In the MTJ element 10 of Practical Example 2-2, a nonmagnetic layer 16 is a spacer layer made of a metal, a nonmagnetic layer 31 is a tunnel barrier layer made of an insulator, a GMR structure is formed in the lower portion (on the substrate side), and a TMR structure is formed in the upper portion. The rest of the arrangement is the same as that of Practical Example 2-1. An example of the MTJ element 10 of Practical Example 2-2 will be explained below.

An FePtB film about 2 nm thick and $Co_{40}Fe_{40}B_{20}$ film about 1 nm thick are sequentially formed as a recording layer 17 on an Au film about 5 nm thick as the spacer layer 16. FePtB is formed at a substrate temperature of 400° C. In addition, an MgO film about 2 nm thick as the tunnel barrier layer 31, an Fe film about 2 nm thick as an interface layer 32, an FePt film about 12 nm thick as a fixed layer 33, an Ru film about 5 nm thick as an electrode 19, and a Ta film about 100 nm thick are sequentially formed on the recording layer 17.

Note that antiferromagnetic layers may also be formed adjacent to a fixed layer 14 and the fixed layer 33 in order to fix the magnetization directions in these layers in one direction. Note also that each magnetic layer except for the fixed layer 14 can be appropriately selected from an ordered alloy, artificial lattice, ferrimagnetic material, and random alloy, as described previously in Practical Examples 1-1 to 1-3.

(c) Practical Example 2-3

FIG. 17 is a sectional view illustrating the arrangement of an MTJ element 10 of Practical Example 2-3. In the MTJ element 10 of Practical Example 2-3, both nonmagnetic layers 16 and 31 are tunnel barrier layers made of an insulator, and TMR structures are formed in both the lower portion (on the substrate side) and upper portion. The arrangement is the same as that of Practical Example 2-1 except that the nonmagnetic layer 31 is an insulator. An example of the MTJ element 10 of Practical Example 2-3 will be explained below.

The arrangement from a substrate 11 to a recording layer 17 is the same as that of Practical Example 2-1. After being formed, the recording layer 17 is ordered into the $L1_0$ structure by performing annealing in a vacuum at 400° C. for 2 hours in a film formation apparatus without exposure to the atmosphere. After this annealing process, an MgO film abut 1.0 nm thick as the tunnel barrier layer 31, an Fe film about 2 nm thick as an interface layer 32, an FePt film about 10 nm thick as a fixed layer 33, an Ru film about 5 nm thick as an electrode 19, and a Ta film about 100 nm thick are sequentially formed. The tunnel barrier layer 16 is an MgO film about 2 nm thick, whereas the film thickness of MgO of the tunnel barrier layer 31 is 1 nm. Therefore, the resistance difference is large, and the magnetoresistive ratio of the tunnel barrier layer 16 is dominant.

Note that antiferromagnetic layers may also be formed adjacent to the fixed layers 14 and 33 in order to fix the magnetization directions in these layers in one direction. Note also that each magnetic layer except for a fixed layer 14 can be appropriately selected from an ordered alloy, artificial lattice, ferrimagnetic material, and random alloy as described previously in Practical Examples 1-1 to 1-3.

(d) Practical Example 2-4

FIG. 18 is a sectional view illustrating the arrangement of an MTJ element 10 of Practical Example 2-4. The MTJ element 10 of Practical Example 2-4 has the same arrangement as that of Practical Example 2-1 except that a fixed layer 33 has the SAF (Synthetic Anti-Ferromagnetic) structure. A TMR structure is formed in the lower portion (on the substrate side), and a GMR structure is formed in the upper portion. The SAF structure is a structure in which two magnetic layers are coupled by antiferromagnetic exchange coupling. The fixed layer 33 includes a first magnetic layer 33-1, a second magnetic layer 33-3, and a nonmagnetic layer 33-2 sandwiched between the first and second magnetic layers 33-1 and 33-3. In this SAF structure, the first and second magnetic layers 33-1 and 33-3 are coupled by antiferromagnetic exchange coupling.

In this case, the magnetization directions in the first and second magnetic layers 33-1 and 33-3 take the antiparallel arrangement, so the leakage magnetic fields from the first and second magnetic layers 33-1 and 33-3 cancel out each other. This effectively reduces the leakage magnetic field from the fixed layer 33. Also, magnetic layers coupled by exchange coupling has the effect of increasing the thermal disturbance resistance by increasing the volume. An example of the material of the nonmagnetic layer 33-2 is one element selected from ruthenium (Ru), osmium (Os), rhenium (Re), and rhodium (Rh), or an alloy containing at least one of these elements.

An example of the MTJ element 10 of Practical Example 2-4 will be explained below. The arrangement from a substrate 11 to a recording layer 17 is the same as that of Practical Example 1-1.

After being formed, the recording layer 17 is ordered into the $L1_0$ structure by performing annealing in a vacuum at 400° C. for 2 hours in a film formation apparatus without exposure to the atmosphere. After this annealing process, a Cu film about 5 nm thick as a spacer layer 31, a Co film about 1 nm thick as an interface layer 32, the SAF structure (to be described later) as the fixed layer 33, an Ru film about 5 nm thick as an electrode 19, and a Ta film about 100 nm thick are sequentially formed.

The fixed layer 33 is obtained by sequentially forming the first magnetic layer 33-1, nonmagnetic layer 33-2, and second magnetic layer 33-3 on the interface layer 32. The first magnetic layer 33-1 is a four-cycle [Pt/Co]$_4$ artificial lattice in which a Pt film about 1 nm thick and Co film about 0.3 nm thick form one cycle. The nonmagnetic layer 33-2 is an Ru film about 0.9 nm thick. The second magnetic layer 33-3 is a five-cycle [Pt/Co]$_5$ artificial lattice in which a Co film about 0.3 nm thick and Pt film about 1 nm thick form one cycle.

Note that the antiferromagnetic coupling can be achieved even when the first and second magnetic layers 33-1 and 33-3 are made of a ferrimagnetic material of an RE-TM alloy. In this case, the nonmagnetic layer 33-2 need not be formed. An example will be explained below with reference to FIGS. 19 and 20.

The RE-TM alloy is in a state in which the magnetic moment of a rare earth metal (RE) and that of a transition metal (TM) are antiferromagnetically coupled. When the RE-TM alloys are stacked, RE portions ferromagnetically couple with each other, and TM portions ferromagnetically couple with each other. In this case, the magnetic moments of the RE and TM cancel out each other, so the magnetic moment as the RE-TM alloy can be adjusted by the composition.

Figure 19:
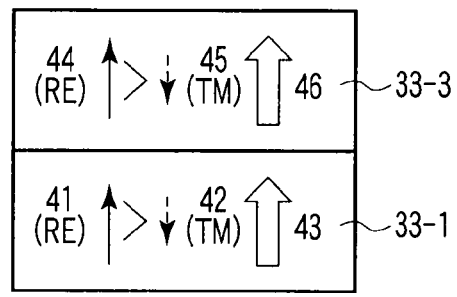
FIG. 19 is a view illustrating another example of the arrangement of a fixed layer 33.

For example, as shown in FIG. 19, in an RE-TM alloy layer 33-1 in which a magnetic moment 41 of the RE is larger than a magnetic moment 42 of the TM, a remaining magnetic moment 43 points in the same direction as that of the magnetic moment 41 of the RE. When an RE-TM alloy layer 33-3 in which a magnetic moment 44 of the RE is larger than a magnetic moment 45 of the TM is stacked on the RE-TM alloy layer 33-1, the magnetic moments 41 and 44 of the RE point in the same direction, and the magnetic moments 42 and 45 of the TM point in the same direction. Consequently, the magnetic moment 43 and a magnetic moment 46 in the two RE-TM alloy layers 33-1 and 33-3 point in the same direction, i.e., take the parallel state.

Figure 20:
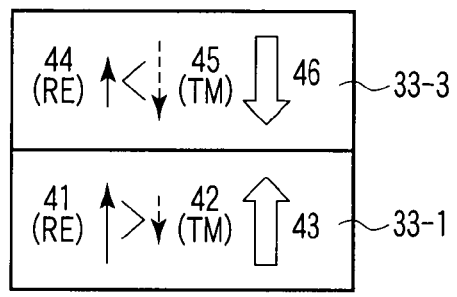
FIG. 20 is a view illustrating still another example of the arrangement of the fixed layer 33.

By contrast, as shown in FIG. 20, when the RE-TM alloy layer 33-3 in which the magnetic moment 44 of the RE is smaller than the magnetic moment 45 of the TM is stacked on the RE-TM alloy layer 33-1, the magnetic moments 43 and 46 in the two RE-TM alloy layers 33-1 and 33-3 take the antiparallel state.

For example, when the content of Tb is 22 at % in a Tb—Co alloy, the magnetic moments of Tb and Co become equal, resulting in a so-called compensation composition by which the magnetic moment is almost zero. These magnetic moments become antiparallel when a Tb$_{25}$Co$_{75}$ film about 10 nm thick and Tb$_{20}$Co$_{80}$ film about 10 nm thick are stacked.

A fixed layer 33 in which two magnetic layers 33-1 and 33-3 are coupled in the antiparallel state can be formed by using the above form. For example, the first magnetic layer 33-1 of the fixed layer 33 is a Tb$_{26}$(Fe$_{71}$Co$_{29}$)$_{74}$ film about 15 nm thick, and the second magnetic layer 33-3 of the fixed layer 33 is a Tb$_{22}$(Fe$_{71}$Co$_{29}$)$_{78}$ film about 20 nm thick. In this case, Tb$_{24}$(Fe$_{71}$Co$_{29}$)$_{76}$ is the compensation composition.

In the MTJ element 10 having the above arrangement, the same magnetization arrangement as that of the fixed layers 14 and 33 shown in FIG. 14 can be achieved by performing magnetization in one direction only once. That is, in the fixed layer 33, the magnetic moment of the TM is smaller than that of the RE, and points in a direction opposite to that of the magnetic moment of the RE. Therefore, magnetization in the fixed layer 33 points in a direction opposite to the magnetizing direction.

When the first and second magnetic layers 33-1 and 33-3 are made of the RE-TM alloy, it is also possible to achieve the antiferromagnetic coupling by forming the nonmagnetic layer 33-2 between the first and second magnetic layers 33-1 and 33-3. An example will be explained below with reference to FIGS. 21 and 22.

Figure 21:
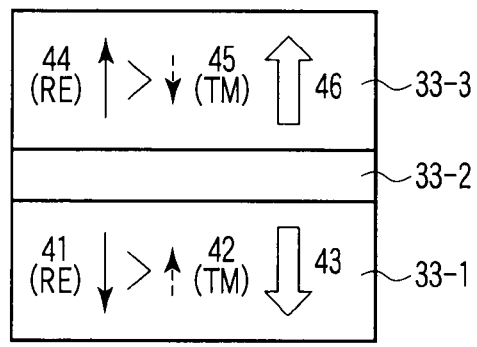
FIG. 21 is a view illustrating still another example of the arrangement of the fixed layer 33.

The magnetic moments 42 and 45 of the TM in the first and second magnetic layers 33-1 and 33-3 shown in FIG. 21 presumably couple with each other by exchange coupling through the nonmagnetic layer 33-2. Similarly, the magnetic moments 42 and 45 of the TM in the first and second magnetic layers 33-1 and 33-3 shown in FIG. 22 presumably couple with each other by exchange coupling through the nonmagnetic layer 33-2.

For example, as shown in FIG. 21, when a metal that antiferromagnetically couples with Co is used as the nonmagnetic layer 33-2, the magnetic moment 41 of the RE is made larger than the magnetic moment 42 of the TM in the RE-TM alloy layer 33-1, and the magnetic moment 44 of the RE is made larger than the magnetic moment 45 of the TM in the RE-TM alloy layer 33-3. That is, when the nonmagnetic layer 33-2 contributes to the antiferromagnetic coupling, the relationship between the magnitudes of the magnetic moment 42 of the TM and the magnetic moment 41 of the RE is set equal to that between the magnitudes of the magnetic moment 45 of the TM and the magnetic moment 44 of the RE. Consequently, the magnetic moments of the TM and RE cancel out each other, so the magnetic moments 43 and 46 become antiparallel. Note that an example of the material of the nonmagnetic layer 33-2 which antiferromagnetically couples with Co is one element selected from ruthenium (Ru), osmium (Os), rhenium (Re), and rhodium (Rh), or an alloy containing at least one of these elements.

Figure 22:
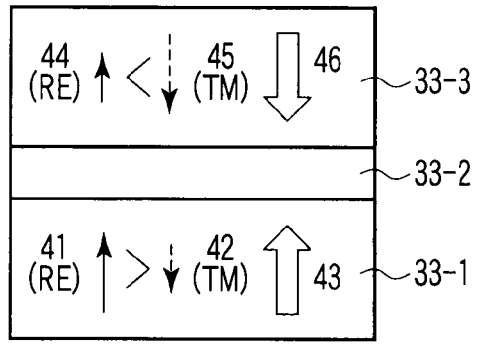
FIG. 22 is a view illustrating still another example of the arrangement of the fixed layer 33.

Also, as shown in FIG. 22, when a metal that ferromagnetically couples with Co is used as the nonmagnetic layer 33-2, the magnetic moment 41 of the RE is made larger than the magnetic moment 42 of the TM in the RE-TM alloy layer 33-1, and the magnetic moment 44 of the RE is made smaller than the magnetic moment 45 of the TM in the RE-TM alloy layer 33-3. That is, when the nonmagnetic layer 33-2 contributes to the antiferromagnetic coupling, the relationship between the magnitudes of the magnetic moment 42 of the TM and the magnetic moment 41 of the RE is set opposite to that between the magnitudes of the magnetic moment 45 of the TM and the magnetic moment 44 of the RE. Consequently, the magnetic moments of the TM and RE cancel out each other, so the magnetic moments 43 and 46 become antiparallel. Note that an example of the material of the nonmagnetic layer 33-2 which ferromagnetically couples with Co is one or more elements selected from platinum (Pt) and palladium (Pd), or an alloy containing at least one of these elements.

Moreover, the fixed layer 33 may also be formed by stacking an RE-TM alloy in which the magnetic moment of the RE is larger than that of the TM, and a metal or alloy mainly containing a transition metal.

In the first embodiment as described in detail above, a conductive nitride having the NaCl structure is used as the underlying layer 23 of the underlying layer 13. Since a nitride having the NaCl structure has a high crystallinity, it is possible to improve the crystallinity, (001)-plane orientation, and smoothness of the ordered alloy (fixed layer 14) formed above the underlying layer 23. That is, a perpendicular magnetization film in which the direction of easy magnetization is perpendicular to the film surface can be formed as the ordered alloy 14.

Also, the use of a nitride as the underlying layer 23 makes it possible to decrease the resistance of the underlying layer 13, and suppress the decrease in magnetoresistive ratio caused by the addition of the series resistance. Since the smoothness of the ordered alloy (fixed layer 14) on the underlying layer 13 improves, the smoothness of MgO formed on this ordered alloy also improves.

Furthermore, the underlying layer 21 made of a metal having an amorphous structure or fine-crystal structure is used as the lowermost layer of the underlying layer 13. This makes it possible to improve the crystallinity and orientation of an oxide of the underlying layer 22 and a nitride of the underlying layer 23. In addition, since the underlying layer 22 made of an oxide having the NaCl structure is formed between the underlying layers 21 and 23, the smoothness of a nitride on the underlying layer 22 can be improved.

The underlying layer 24 having the tetragonal structure or cubic structure, having a lattice constant of 2.7 to 3.0 Å or 3.7 to 4.2 Å, and made of a metal orienting in the (001) plane is formed between the underlying layer 23 and ordered alloy (fixed layer 14). The orientation of the ordered alloy can be further improved by thus forming the underlying layer 24 as a buffer layer between a nitride as the underlying layer 23 and the ordered alloy, rather than by directly forming the ordered alloy on the nitride.

Also, an ordered alloy having the $L1_0$ structure can be oriented in the (001) plane by forming this ordered alloy on the underlying layer 13. Furthermore, MgO orienting in the (100) plane can be formed by forming MgO on the ordered alloy orienting in the (001) plane. As a consequence, a high magnetoresistive ratio can be achieved.

No element that diffuses in the heating step necessary to order the ferromagnetic alloy 14 having the $L1_0$ structure and deteriorates the magnetic characteristic and electrical characteristic of the MTJ element 10 is used in the underlying layer 13. This makes it possible to prevent deterioration of the magnetic characteristic and electrical characteristic of the MTJ element 10 even when the underlying layer 13 of this embodiment is used.

Second Embodiment

The second embodiment is an example in which an MRAM is formed by using the MTJ element 10 according to the first embodiment.

Figure 23:
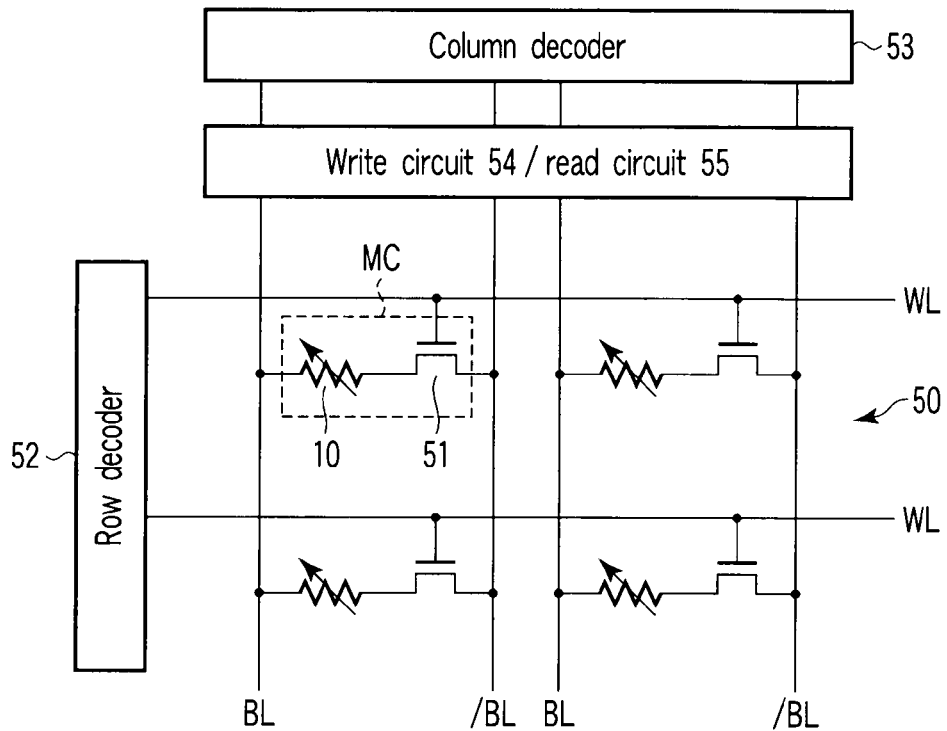
FIG. 23 is a circuit diagram illustrating the arrangement of an MRAM according to the second embodiment.

FIG. 23 is a circuit diagram illustrating the arrangement of the MRAM according to the second embodiment of the present invention. This MRAM has a memory cell array 50 including memory cells MC arranged in a matrix. In the memory cell array 50, bit line pairs BL and /BL are formed such that each bit line runs in the column direction. Also, word lines WL are formed in the memory cell array 50 such that each word line runs in the row direction.

The memory cells MC are arranged at the intersections of the bit lines BL and word lines WL. Each memory cell MC comprises the MTJ element 10, and a selection transistor 51 that is an N-channel MOS transistor. One terminal of the MTJ element 10 is connected to the bit line BL. The other terminal of the MTJ element 10 is connected to the drain terminal of the selection transistor 51. The gate terminal of the selection transistor 51 is connected to the word line WL. The source terminal of the selection transistor 51 is connected to the bit line /BL.

A row decoder 52 is connected to the word lines WL. A write circuit 54 and read circuit 55 are connected to the bit line pairs BL and /BL. A column decoder 53 is connected to the write circuit 54 and read circuit 55. The row decoder 52 and column decoder 53 select each memory cell MC.

Data is written in the memory cell MC as follows. First, to select the memory cell MC as an object of data write, the word line WL connected to the memory cell MC is activated. This turns on the selection transistor 51.

A bidirectional write current Iw is supplied to the MTJ element 10 in accordance with the write data. More specifically, when supplying the write current Iw to the MTJ element 10 from the left to the right, the write circuit 54 applies a positive voltage to the bit line BL, and the ground voltage to the bit line /BL. When supplying the write current Iw to the MTJ element 10 from the right to the left, the write circuit 54 applies a positive voltage to the bit line /BL, and the ground voltage to the bit line BL. In this manner, data "0" or "1" can be written in the memory cell MC.

Data is read from the memory cell MC as follows. First, the selection transistor 51 of the selected memory cell MC is turned on. The read circuit 55 supplies a read current Ir flowing from the right to the left, for example, to the MTJ element 10. On the basis of the read current Ir, the read circuit 55 detects the resistance value of the MTJ element 10. In this way, the data stored in the MTJ element 10 can be read.

Figure 24:
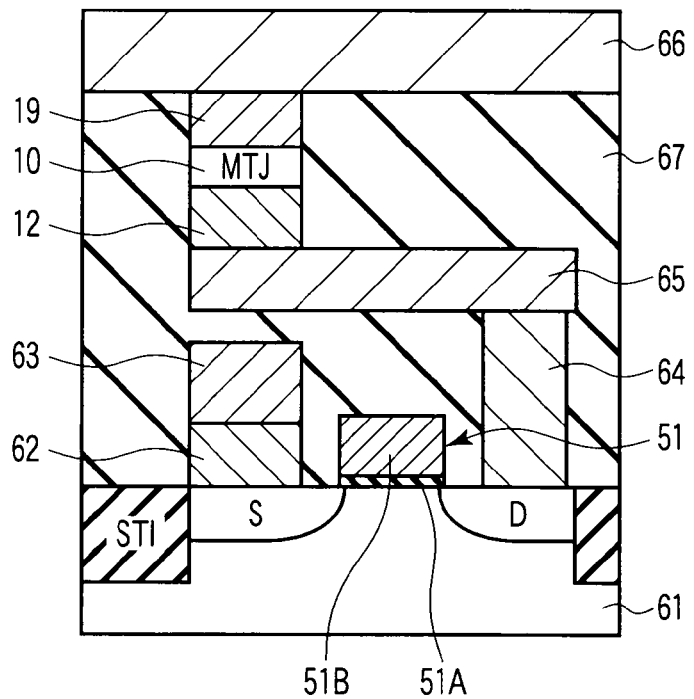
FIG. 24 is a sectional view illustrating the arrangement of the MRAM, particularly, a memory cell MC.

The structure of the MRAM will be explained below. FIG. 24 is a sectional view illustrating the arrangement of the MRAM, particularly, the memory cell MC.

An element isolation insulating layer is formed in the surface region of a P-type semiconductor substrate 61. A portion of the surface region of the semiconductor substrate 61 in which no element isolation insulating layer is formed is an element region (active area) where an element is to be formed. The element isolation insulating layer is formed by, e.g., STI (Shallow Trench Isolation). Silicon oxide or the like is used as STI.

In the element region of the semiconductor substrate 61, a source region S and drain region D are formed apart from each other. Each of the source region S and drain region D is an $N^+$-type diffusion region formed by heavily doping an $N^+$-type impurity into the semiconductor substrate 61. A gate electrode 51B is formed on a gate insulating film 51A on the semiconductor substrate 61 between the source region S and drain region D. The gate electrode 51B functions as the word line WL. The selection transistor 51 is thus formed on the semiconductor substrate 61.

An interconnection layer 63 is formed on a contact 62 on the source region S. The interconnection layer 63 functions as the bit line /BL.

An extraction line 65 is formed on a contact 64 on the drain region D. The MTJ element 10 sandwiched between a lower electrode 12 and upper electrode 19 is formed on the extraction line 65. An interconnection layer 66 is formed on the upper electrode 19. The interconnection layer 66 functions as the bit line BL. A portion between the semiconductor substrate 61 and interconnection layer 66 is filled with an interlayer dielectric layer 67 such as silicon oxide.

As described in detail above, the MRAM can be formed by using the MTJ element 10 according to the first embodiment. Note that the MTJ element 10 can be used not only in a spin transfer torque writing type magnetic memory, but also in a domain wall displacement type magnetic memory.

Note also that the MRAM according to the second embodiment is applicable to various apparatuses. Some application examples of the MRAM will be explained below.

Application Example 1

Figure 25:
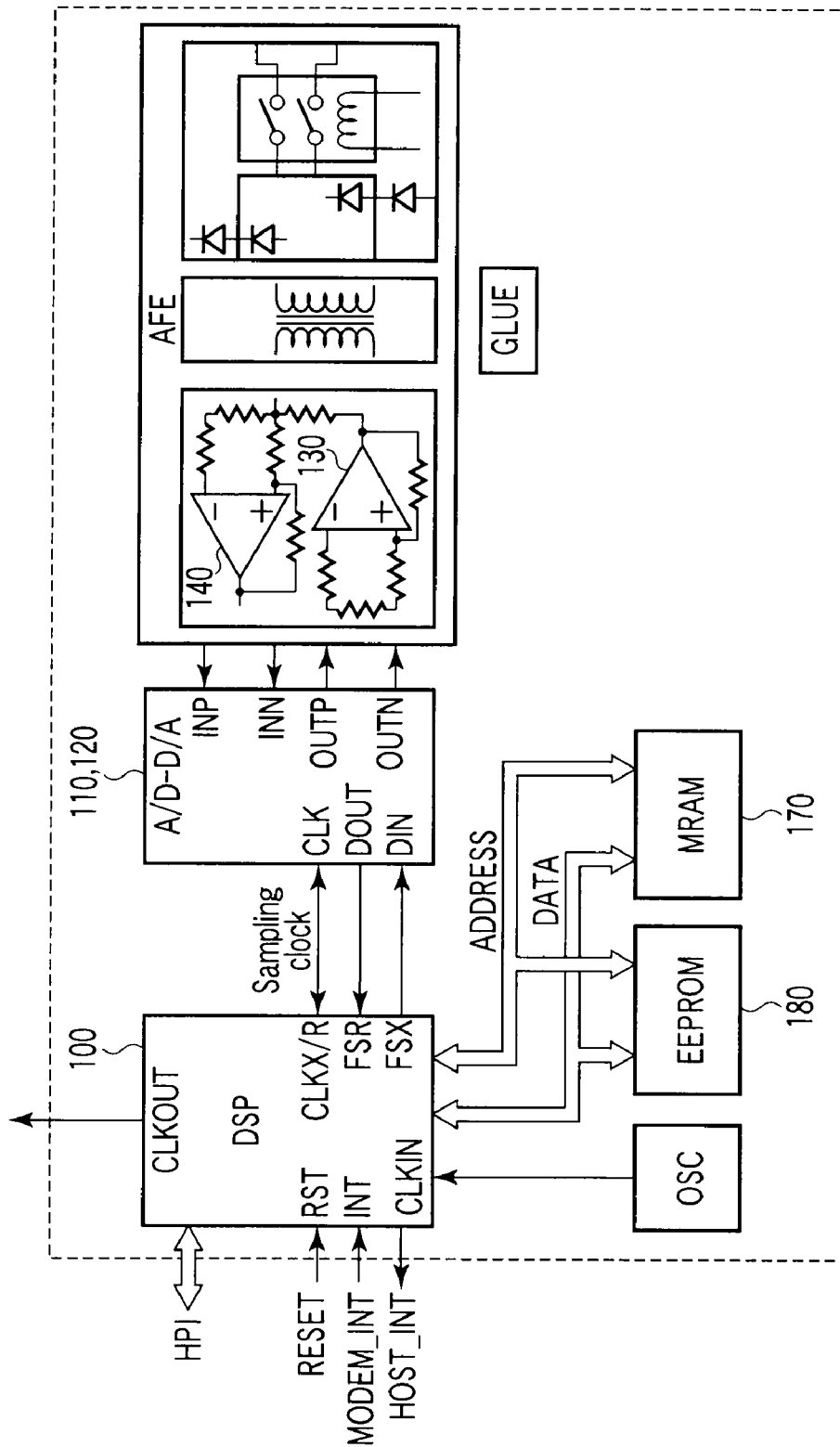
FIG. 25 is a block diagram illustrating a digital subscriber line (DSL) data path unit of a DSL modem according to Application Example 1 of the MRAM.

FIG. 25 specifically shows a digital subscriber line (DSL) data path portion of a DSL modem. This modem comprises a programmable digital signal processor (DSP) 100, analog-to-digital (A/D) converter 110, digital-to-analog (D/A) converter 120, transmission driver 130, reception amplifier 140, and the like.

No bandpass filter is shown in FIG. 25. Instead, FIG. 25 shows an MRAM 170 of this embodiment and an EEPROM 180 as various types of optional memories for storing a line code program (a program to be executed by the DSP to select and operate a modem in accordance with, e.g., coded subscriber line information and transmission conditions (line codes: QAM, CAP, RSK, FM, AM, PAM, DWMT, and the like)).

Note that this application example uses two types of memories, i.e., the MRAM 170 and EEPROM 180 as memories for storing the line code program. However, the EEPROM 180 may also be replaced with an MRAM. That is, it is also possible to use only MRAMs instead of using two types of memories.

Application Example 2

FIG. 26 shows a portable phone terminal 300 as another application example. A communication unit 200 for implementing a communication function comprises, e.g., a transmitting/receiving antenna 201, an antenna duplexer 202, a receiver 203, a baseband processor 204, a DSP 205 to be used as a voice codec, a loudspeaker (telephone receiver) 206, a microphone (telephone transmitter) 207, a transmitter 208, and a frequency synthesizer 209.

The portable phone terminal 300 also has a controller 220 for controlling each unit of the portable phone terminal. The controller 220 is a microcomputer obtained by connecting a CPU 221, a ROM 222, an MRAM 223 of this embodiment, and a flash memory 224 via a bus 225. Programs to be executed by the CPU 221 and necessary data such as display fonts are prestored in the ROM 222.

The MRAM 223 is mainly used as a work area. The CPU 221 uses the MRAM 223 when storing data currently being calculated while executing a program as needed, and temporarily storing data to be exchanged between the controller 220 and each unit. When using a method that stores the setting conditions and the like immediately before the power supply of the portable phone terminal 300 is turned off, and sets the same conditions when the power supply is turned on next time, the flash memory 224 stores the set parameters. Accordingly, the stored set parameters do not disappear even when the power supply of the portable phone terminal 300 is turned off.

In addition, the portable phone terminal 300 has an audio reproduction processor 211, an external output terminal 212, an LCD controller 213, a display LCD (Liquid Crystal Display) 214, a ringer 215 for generating a ring back tone, and the like. The audio reproduction processor 211 reproduces audio information input to the portal phone terminal 300 (or audio information stored in an external memory 240 (to be described later)). The reproduced audio information can be extracted outside by, e.g., transmitting the information to headphones, a portable speaker, or the like via the external output terminal 212. Thus, the audio reproduction processor 211 makes it possible to reproduce audio information. The LCD controller 213 receives display information from, e.g., the CPU 221 via the bus 225, converts the information into LCD control information for controlling the LCD 214, and drives the LCD 214 to display an image.

The portable phone terminal 300 further comprises interface circuits (I/Fs) 231, 233, and 235, the external memory 240, an external memory slot 232, a key operation unit 234, an external input/output terminal 236, and the like. The external memory 240 such as a memory card is inserted into the external memory slot 232. The external memory slot 232 is connected to the bus 225 via the interface circuit (I/F) 231. Since the portable phone terminal 300 has the slot 232 as described above, it is possible to write internal information of the portable phone terminal 300 into the external memory 240, or input information (e.g., audio information) stored in the external memory 240 to the portable phone terminal 300.

The key operation unit 234 is connected to the bus 225 via the interface circuit (I/F) 233. Key input information from the key operation unit 234 is transmitted to, e.g., the CPU 221. The external input/output terminal 236 is connected to the bus 225 via the interface circuit (I/F) 233, and functions as a terminal that externally inputs various information to the portable phone terminal 300, or outputs information outside the portable phone terminal 300.

Note that this application example uses the ROM 222, MRAM 223, and flash memory 224. However, it is also possible to replace the flash memory 224 with an MRAM, and replace the ROM 222 with an MRAM as well.

Application Example 3

FIGS. 27 to 31 each illustrate an example in which the MRAM is applied to a card (MRAM card) such as SmartMedia for storing media contents.

Figure 27:
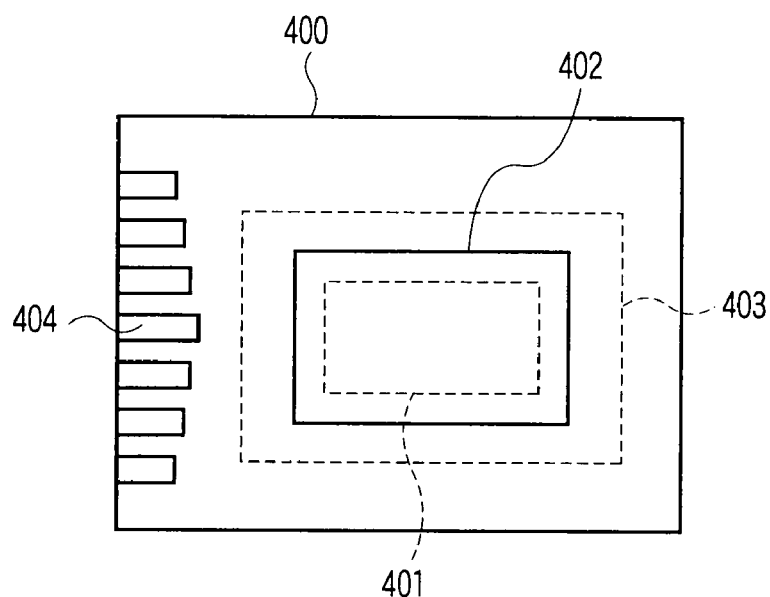
FIG. 27 is a plan view illustrating an MRAM card 400 according to Application Example 3 of the MRAM.

As shown in FIG. 27, an MRAM card main body 400 contains an MRAM chip 401. The card main body 400 has an opening 402 formed in a position corresponding to the MRAM chip 401, so the MRAM chip 401 is exposed. The opening 402 has a shutter 403 that protects the MRAM chip 401 when this MRAM card is carried by a user. The shutter 403 is made of a material, such as ceramic, having an effect of shielding an external magnetic field. Data is transferred by exposing the MRAM chip 401 by opening the shutter 403. External terminals 404 are used to extract the contents data stored in the MRAM card outside.

Figure 29:
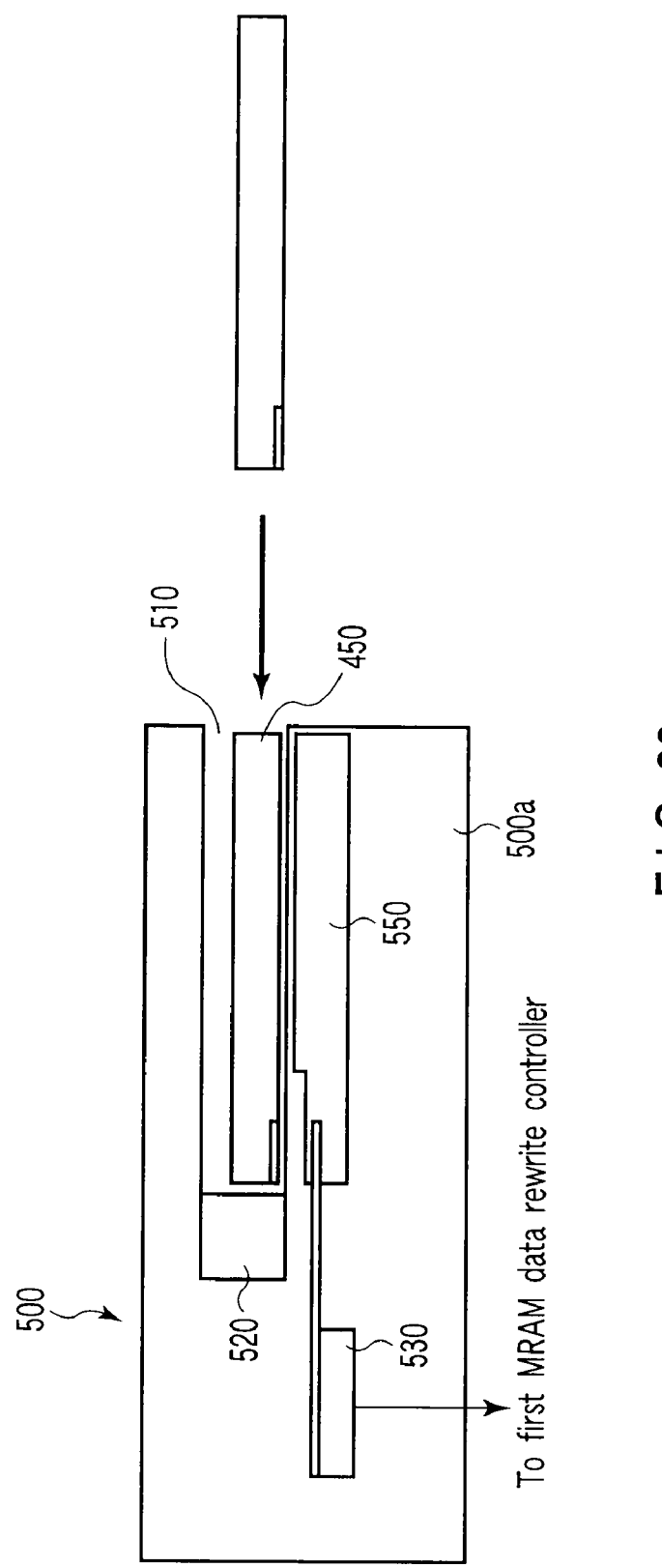
FIG. 29 is a sectional view illustrating a transfer apparatus 500 for transferring data to the MRAM card.

FIGS. 28 and 29 are a plan view and sectional view, respectively, of a card insertion type transfer apparatus 500 for transferring data to the MRAM card described above.

The data transfer apparatus 500 has a housing portion 500a. A first MRAM card 550 is housed in the housing portion 500a. The housing portion 500a has external terminals 530 electrically connected to the first MRAM card 550. Data in the first MRAM card 550 is rewritten by using the external terminals 530.

A second MRAM card 450 used by an end user is inserted from an insertion portion 510 of the transfer apparatus 500 as indicated by the arrow. The second MRAM card 450 is pushed until it is stopped by a stopper 520. The stopper 520 also functions as a member for aligning the first MRAM card 550 and second MRAM card 450. When the second MRAM card 450 is set in a predetermined position, a first MRAM data rewrite controller supplies a control signal to the external terminals 530, thereby transferring data stored in the first MRAM card 550 to the second MRAM card 450.

Figure 30:
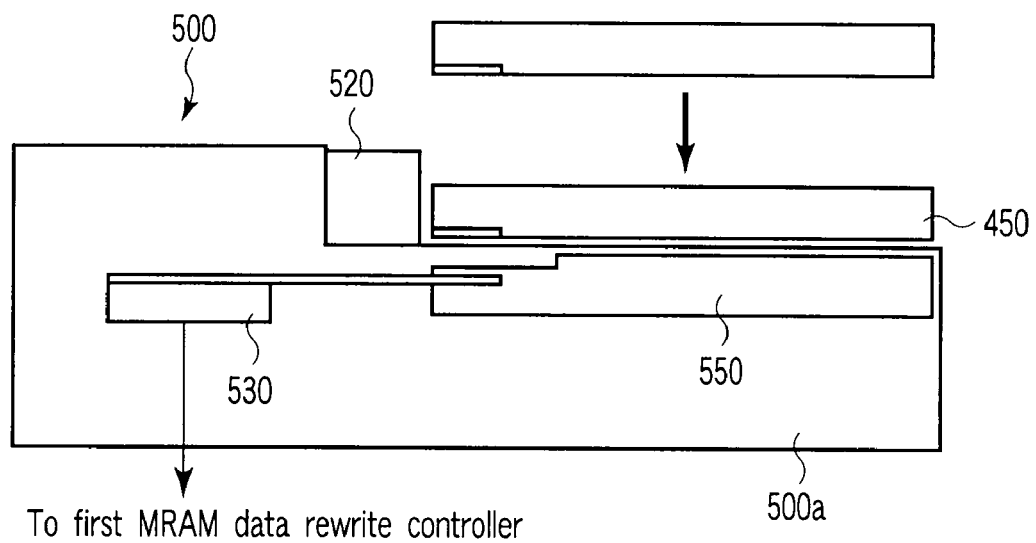
FIG. 30 is a sectional view illustrating a fitting type transfer apparatus 500 for transferring data to the MRAM card.

FIG. 30 shows a fitting type transfer apparatus. In this transfer apparatus, a second MRAM card 450 is fitted on a first MRAM card 550 as indicated by the arrow by using a stopper 520 as a guide. A transfer method is the same as that of the card insertion type apparatus, so the explanation will not be repeated.

Figure 31:
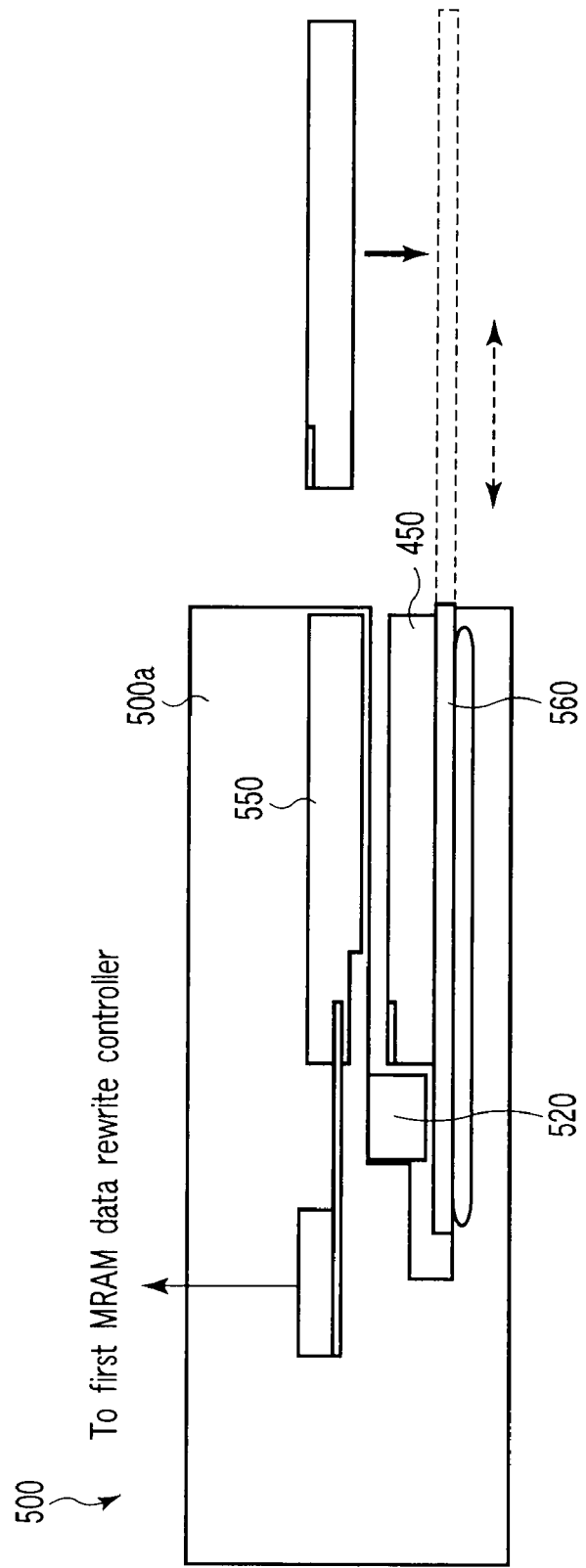
FIG. 31 is a sectional view illustrating a sliding type transfer apparatus 500 for transferring data to the MRAM card.

FIG. 31 shows a sliding type transfer apparatus. Similar to a CD-ROM drive or DVD drive, a transfer apparatus 500 has a receiving slide 560 that moves as indicated by the arrows. A second MRAM card 450 is placed on the receiving slide 560 having moved to the position indicated by the broken lines, and slid inside the transfer apparatus 500. The second MRAM card 450 is slid such that its leading end portion abuts against a stopper 520 in the same manner as in the card insertion type apparatus, and a transfer method is also the same as that of the card insertion type apparatus. Therefore, the explanation will not be repeated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a first underlying layer having one of an amorphous structure and a fine crystal structure;
a second underlying layer provided on the first underlying layer and containing an oxide having an NaCl structure;
a third underlying layer provided on the first underlying layer, having an NaCl structure, and containing a nitride orienting in a (001) plane;
a first magnetic layer provided on the third underlying layer, having magnetic anisotropy perpendicular to a film surface, having an L10 structure, and containing a ferromagnetic alloy orienting in a (001) plane;
a first nonmagnetic layer provided on the first magnetic layer; and
a second magnetic layer provided on the first nonmagnetic layer and having magnetic anisotropy perpendicular to a film surface.

2. The element according to claim 1, wherein
a magnetic direction is invariable in one of the first magnetic layer and the second magnetic layer, and
a magnetization direction is variable in the other of the first magnetic layer and the second magnetic layer.

3. The element according to claim 1, wherein the third underlying layer contains a nitride containing at least one element selected from a group consisting of Ti, Zr, Nb, V, Hf, Ta, Mo, W, B, Al, and Ce.

4. The element according to claim 1, wherein the first underlying layer contains a metal containing at least one element selected from a group consisting of Fe, Co, and Ni, and at least one element selected from a group consisting of B, Nb, Si, Ta, and Zr.

5. The element according to claim 1, wherein the second underlying layer contains an oxide containing at least one element selected from a group consisting of Mg, Ca, V, Nb, Mn, Fe, Co, and Ni.

6. The element according to claim 1, further comprising a fourth underlying layer provided between the third underlying layer and the first magnetic layer, having one of a tetragonal structure and a cubic structure, having one of a lattice constant of 2.7 to 3.0 Å and a lattice constant of 3.7 to 4.2 Å, and containing a metal orienting in a (001) plane.

7. The element according to claim 6, wherein the fourth underlying layer contains one of a metal containing at least one element selected from a group consisting of Rh, Ir, Pd, Pt, Cu, Ag, and Au, and an alloy mainly containing at least one of Rh, Ir, Pd, Pt, Cu, Ag, and Au.

8. The element according to claim 1, wherein the first magnetic layer contains at least one element selected from a group consisting of Fe, Co, Ni, and Cu, and at least one element selected from a group consisting of Pd, Pt, and Au.

9. The element according to claim 8, wherein the first magnetic layer contains at least one element selected from a group consisting of B, Zr, and Ag at a total concentration of not more than 20 at %.

10. The element according to claim 8, wherein the first magnetic layer contains one of an oxide and nitride containing at least one element selected from a group consisting of Mg, Ca, B, Al, Si, Fe, Co, Ni, Ti, Zr, Hf, V, Nb, Ta, Cr, Mo, and W at a concentration of not more than 20 vol %.

11. The element according to claim 1, wherein the first nonmagnetic layer contains magnesium oxide.

12. The element according to claim 1, wherein the second magnetic layer contains a ferromagnetic alloy having an L10 structure and orienting in a (001) plane.

13. The element according to claim 12, wherein the second magnetic layer contains at least one element selected from a group consisting of Fe, Co, Ni, and Cu, and at least one element selected from a group consisting of Pd, Pt, and Au.

14. The element according to claim 1, further comprising a fifth underlying layer provided between the third underlying layer and the first magnetic layer, and having a perovskite structure orienting in a (001) plane.

15. The element according to claim 14, wherein the fifth underlying layer is conductive, and a chemical formula thereof is expressed by ABO3:
where "A" is selected from a group consisting of Ca, Sr, Ba and La, and
"B" is selected from a group consisting of Ti, V, Cr, Mn, Fe, Co, Ni, Nb, Mo, Ru, Ir and Pb.

16. The element according to claim 1, further comprising:
a second nonmagnetic layer provided on the second magnetic layer; and
a third magnetic layer provided on the second nonmagnetic layer, having magnetic anisotropy perpendicular to a film surface, and having an invariable magnetization direction, and
wherein the magnetization direction in the first magnetic layer is invariable, and
the magnetization direction in the second magnetic layer is variable.

17. The element according to claim 16, wherein the second nonmagnetic layer contains one of a metal containing at least one element selected from a group consisting of Au, Ag, and Cu, and an alloy mainly containing at least one of Au, Ag, and Cu.

18. The element according to claim 16, wherein the second nonmagnetic layer contains magnesium oxide.

* * * * *